(12) United States Patent
Wasinger

(10) Patent No.: US 10,410,464 B2
(45) Date of Patent: Sep. 10, 2019

(54) CABINET AIR FILTRATION SYSTEM

(71) Applicant: AGS LLC, Las Vegas, NV (US)

(72) Inventor: Gerald Francis Wasinger, Berkeley Lake, GA (US)

(73) Assignee: AGS LLC, Las Vegas, NV (US)

( * ) Notice: Subject to any disclaimer, the term of this patent is extended or adjusted under 35 U.S.C. 154(b) by 0 days.

(21) Appl. No.: 15/661,581

(22) Filed: Jul. 27, 2017

(65) Prior Publication Data

US 2019/0035207 A1 Jan. 31, 2019

(51) Int. Cl.
G07F 17/32 (2006.01)
H05K 5/02 (2006.01)
H05K 5/00 (2006.01)
H05K 7/20 (2006.01)
G07F 17/34 (2006.01)
B01D 46/00 (2006.01)

(52) U.S. Cl.
CPC ..... *G07F 17/3216* (2013.01); *B01D 46/0002* (2013.01); *B01D 46/0045* (2013.01); *G07F 17/3213* (2013.01); *G07F 17/3225* (2013.01); *G07F 17/3241* (2013.01); *G07F 17/34* (2013.01); *H05K 5/0017* (2013.01); *H05K 5/0208* (2013.01); *H05K 5/0213* (2013.01); *H05K 5/0217* (2013.01); *H05K 5/0221* (2013.01); *H05K 7/20145* (2013.01); *H05K 7/20172* (2013.01); *H05K 7/20181* (2013.01); *H05K 7/20209* (2013.01); *B01D 2279/40* (2013.01)

(58) Field of Classification Search
None
See application file for complete search history.

(56) References Cited

U.S. PATENT DOCUMENTS

| 4,602,921 | A  | * | 7/1986  | Shinohara | ............... | B03C 3/019 |
|           |    |   |         |           |                 | 361/230    |
| 2006/0253702 | A1 | * | 11/2006 | Lowell | ..................... | G06F 21/33 |
|           |    |   |         |           |                 | 713/156    |
| 2013/0053129 | A1 | * | 2/2013  | LeMay | ............... | G07F 17/3223 |
|           |    |   |         |           |                 | 463/25     |

(Continued)

OTHER PUBLICATIONS

U.S. Appl. No. 16/022,446, title "Closed Loop Cabinet Cooling", filed Jun. 28, 2018, 96 pages.

*Primary Examiner* — James S. McClellan
*Assistant Examiner* — Peter J Iannuzzi
(74) *Attorney, Agent, or Firm* — Vierra Magen Marcus LLP

(57) ABSTRACT

An air filtration and cooling system for an electronic gaming machine is described. The electronic gaming machine can provide play of a wager-based game. The air filtration and cooling system is disposed within an interior of the gaming machine cabinet. The air filtration and cooling system can include a plenum which guides air through system. Electrical components, such as a game controller and a power supply, can be located within the plenum. For cooling purposes, air from outside the cabinet can be blown over the electrical components. Prior to allowing the air to pass over the electrical components, the air from outside the cabinet can be filtered, such as using a two-stage filter. The filtration system is configured to remove contaminants in the air which can damage the electrical components, such as contaminants associated with cigarette smoke.

20 Claims, 10 Drawing Sheets

(56) References Cited

U.S. PATENT DOCUMENTS

| | | | |
|---|---|---|---|
| 2013/0061749 A1* | 3/2013 | LeSourd | B03C 3/017 95/70 |
| 2013/0244795 A1* | 9/2013 | Waxman | G07F 17/3202 463/46 |
| 2013/0303264 A1* | 11/2013 | Gill | G07F 17/3216 463/25 |
| 2015/0243122 A1* | 8/2015 | Saffari | G07F 17/329 463/17 |

* cited by examiner

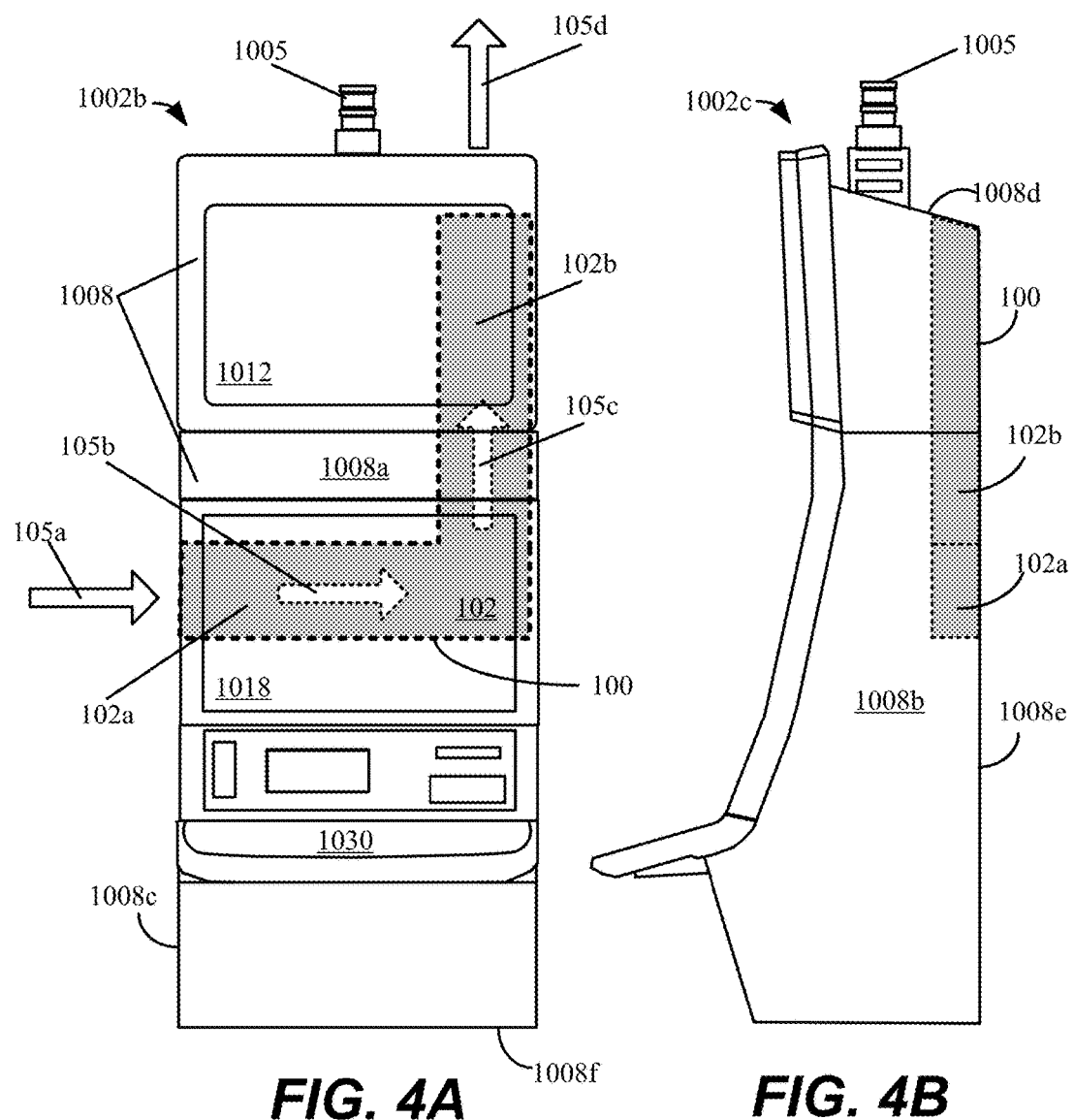
*FIG. 4A*  *FIG. 4B*

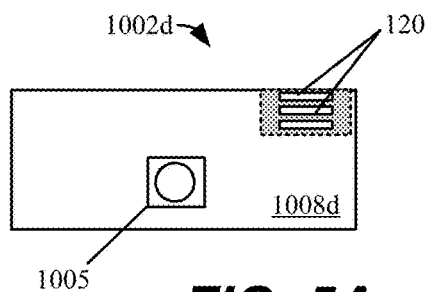
FIG. 5A
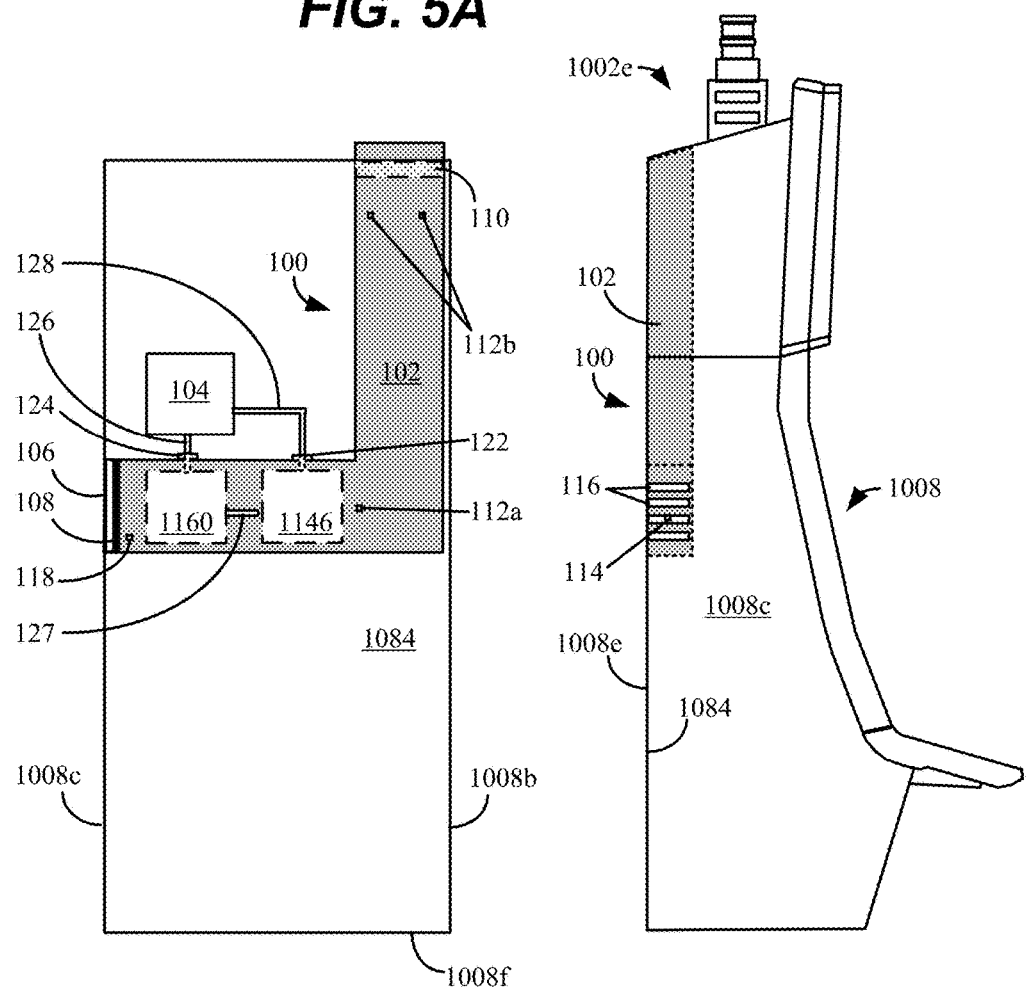
FIG. 5B  FIG. 5C

CABINET AIR FILTRATION SYSTEM

TECHNICAL FIELD

The present disclosure relates to operating a gaming machine to generate a wager-based game.

Slot-type electronic gaming machines, often referred as slot machines, are popular fixtures in casino environments. Slot machines use mechanical reels or video reels to present an outcome of a slot game to a player. Player's derive entertainment value from the unique ways in which the slot game is played and presented on the gaming machine.

For a casino operator, the entertainment value of slot machines is very important. It attracts players to the casino. Another important factor is the costs associated with maintaining the slot machines. Maintenance costs reduce the profitability of the casino. In view of the above, new slot machine designs and methods of operation which reduce maintenance costs are desired.

OVERVIEW

Various embodiments of the present invention generally relate to operating a gaming machine to generate a wager-based video slot game. In particular embodiments, an air filtration and cooling system for an electronic gaming machine is described. The air filtration and cooling system is disposed within an interior of the gaming machine cabinet. The air filtration and cooling system can include a plenum which guides air through air filtration and cooling system. Electrical components, such as a game controller and a power supply, can be located within the plenum. For cooling purposes, air from outside the cabinet can be blown over the electrical components. Prior to allowing the air to pass over the electrical components, the air from outside the cabinet can be filtered, such as using a two-stage filter. The filtration system is configured to remove contaminants in the air which can damage the electrical components, such as contaminants associated with cigarette smoke.

One aspect of the invention is related to a gaming machine. The gaming machine can be generally characterized as having cabinet. The cabinet can include an entry that provides access to an interior of the cabinet, a locking mechanism coupled to the entry and a plurality of security sensors where at least one of the plurality of security sensors is used to detect access to the interior of the cabinet. A power supply can be disposed within the interior of the cabinet and can be configured to receive power from an external power source. A power-off security device can be disposed within the interior of the cabinet and can be coupled to one or more of the plurality security sensors that are configured to monitor access to the cabinet when the power supply is unpowered.

The gaming machine can further include a display, coupled to the cabinet. The display can be configured to output content associated with play of a wager-based game. A non-volatile memory can be disposed within the interior of the cabinet. The non-volatile memory can be configured to store gaming software used to generate a wager-based game on the gaming machine. A power-hit tolerant memory can be disposed within the interior of the cabinet. The power-hit tolerant memory can be configured to store crucial data associated with play of a plurality of instances of the wager-based game.

A gaming machine controller, including a processor and a memory, can be disposed within the interior of the cabinet, and can be coupled to the power supply, the power-off security device, the plurality of security sensors, the display, the non-volatile memory and the power-hit tolerant memory. The gaming machine controller can be configured to 1) control play of the wager-based game; 2) validate the gaming software, 3) verify integrity of crucial data stored within the power-hit tolerant memory, 4) monitor the power-off security device and the plurality of security sensors to detect tilt conditions and 5) store the crucial data associated with the plurality of instances of the wager-based game to the power-hit tolerant memory.

The gaming machine can include an air filtration and cooling system having a plenum, fan and filter mechanism. The plenum disposed within the interior of the cabinet where a first end of the plenum is coupled to a first vent on an exterior of the cabinet and a second end of the plenum is coupled to a second vent on the exterior of the cabinet. Air from outside the cabinet can enter through the first vent, enter the plenum, flow through plenum and exit through the second vent. A fan, disposed within the plenum, can provide a pressure gradient which drives the air through the plenum.

A filter mechanism, disposed within the plenum, can be configured to receive the air from the exterior of the cabinet and filter out at least contaminants associated with cigarette smoke. The gaming machine controller can be disposed within the plenum where the air passed through the filter mechanism is passed over the gaming machine controller to dissipate heat emanating from the gaming machine controller.

BRIEF DESCRIPTION OF THE DRAWINGS

The disclosure may best be understood by reference to the following description taken in conjunction with the accompanying drawings, which illustrate particular embodiments of the present invention.

FIGS. 4A and 4B illustrate front and side views of the gaming machine in FIG. 1 including a cabinet air filtration system in accordance with embodiments of the present invention.

FIGS. 5A, 5B and 5C illustrate a top view of a cabinet, a view of a back of the cabinet and a side view of a cabinet including a cabinet air filtration system in accordance with embodiments of the present invention.

DETAILED DESCRIPTION

Reference will now be made in detail to some specific examples of the invention including the best modes contemplated by the inventors for carrying out the invention. Examples of these specific embodiments are illustrated in the accompanying drawings. While the present disclosure is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular embodiments of the present invention may be implemented without some or all of these specific details. In other instances, well known process operations have not been described in detail in order not to unnecessarily obscure the present invention.

In general, gaming systems which provide wager-based games are described. In particular, with respect to FIGS. 1 and 2, gaming system including a wager-based gaming machines in communication with network devices are described. The gaming system can include wager-based games where a progressive prize is possible as an award. A gaming machine controller configured to generate a wager-based game in accordance with player selected volatility parameters is described with respect to FIG. 3.

With respect to FIGS. 4A-6B, a cabinet air filtration and cooling system is described. The cabinet air filtration and cooling system is configured to reduce an amount of smoke including particulate matter and resins entering the gaming machine cabinet. Cigarette and cigar smoke can damage electrical components within the gaming machine such that the operating lifetime of the components is reduced. By removing the smoke and dust components, the filtration system prevents damage to the system components and reduces maintenance costs.

In more detail, With respect to FIGS. 4A and 4B, an exemplary placement of the cabinet air filtration and cooling system within the gaming machine cabinet is described. With respect to FIGS. 5A-6B, components of the cabinet air filtration system and different embodiments of the system are described. In particular, an air plenum is described which includes a filtration system on one end and a fan on the other. The fan drives filtered air through the plenum to cool components, such as a game controller and a power supply.

Figure 7:
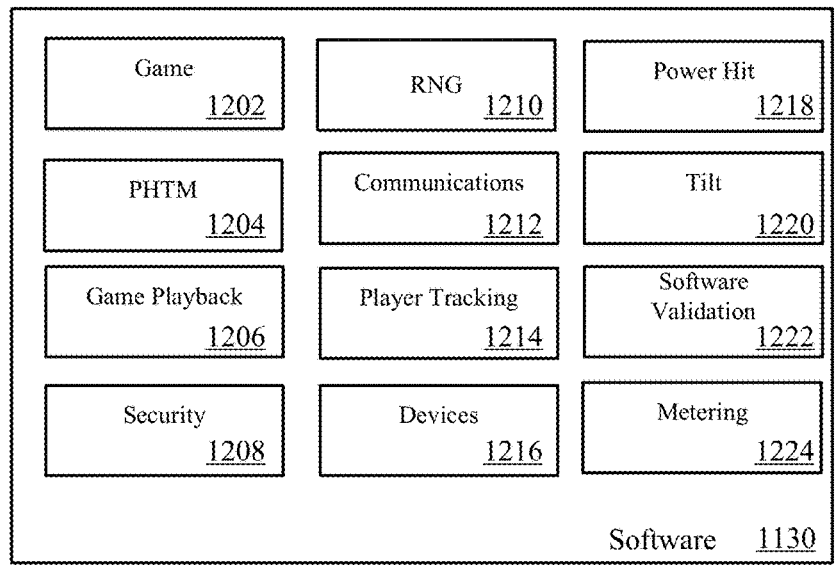
FIG. 7 illustrates a block diagram of gaming software in accordance with embodiments of the present invention.

Gaming software used to generate the wager-based game is discussed with respect to FIG. 7. With respect to FIG. 8, a power hit tolerant memory configured to store crucial data generated from playing the wager-based game is discussed. The crucial data can include information associated with selected volatility parameters and wager-based games generated using the selected volatility parameters.

Figure 9:
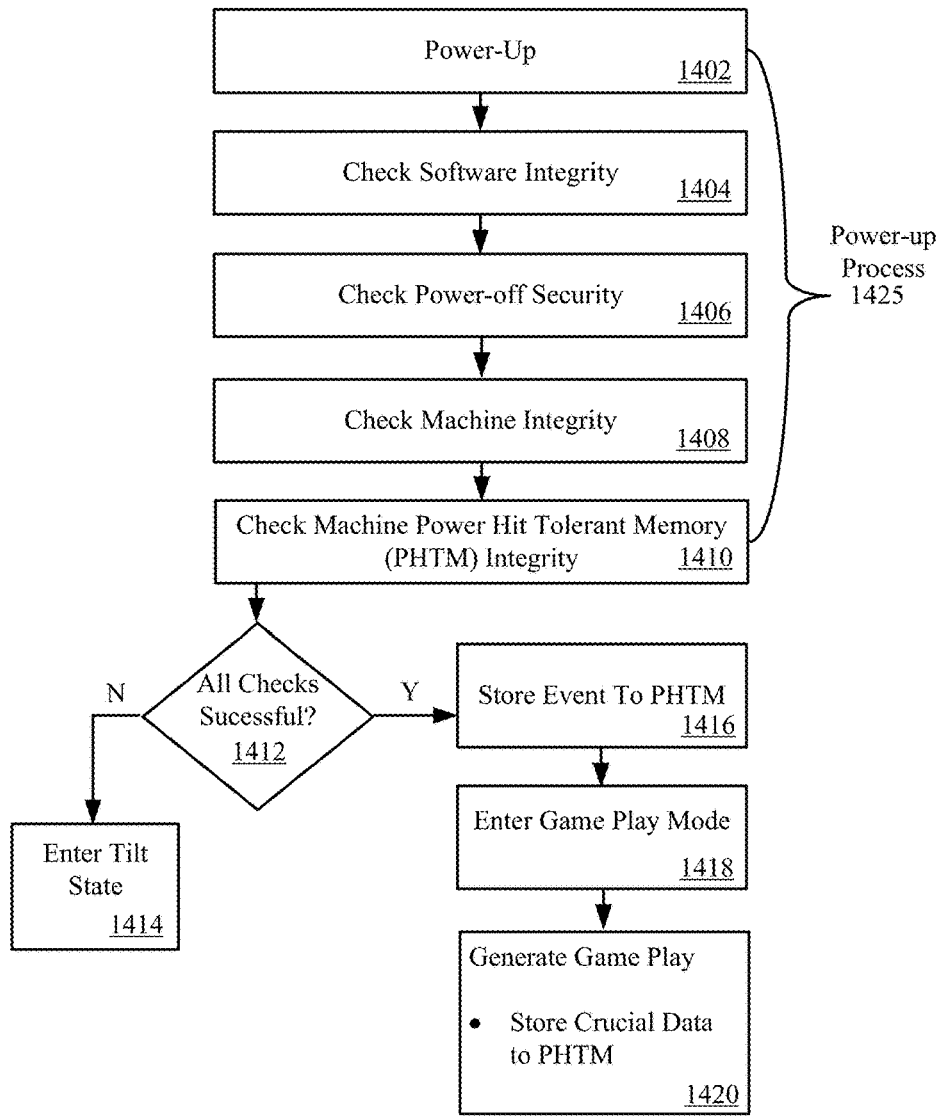
FIG. 9 illustrates a method for responding to a power interruption on a gaming machine in accordance with embodiments of the present invention.

With respect to FIG. 9, a method for responding to a power interruption on a gaming machine, which utilizes the power hit tolerant memory, is discussed. With respect to FIG. 10, a method of powering up a gaming machine is described. Finally, with respect to FIG. 11, a method playing back a game, such as a wager-based game including a first primary game and a second primary game, previously played on a gaming machine is discussed.

Figure 1:
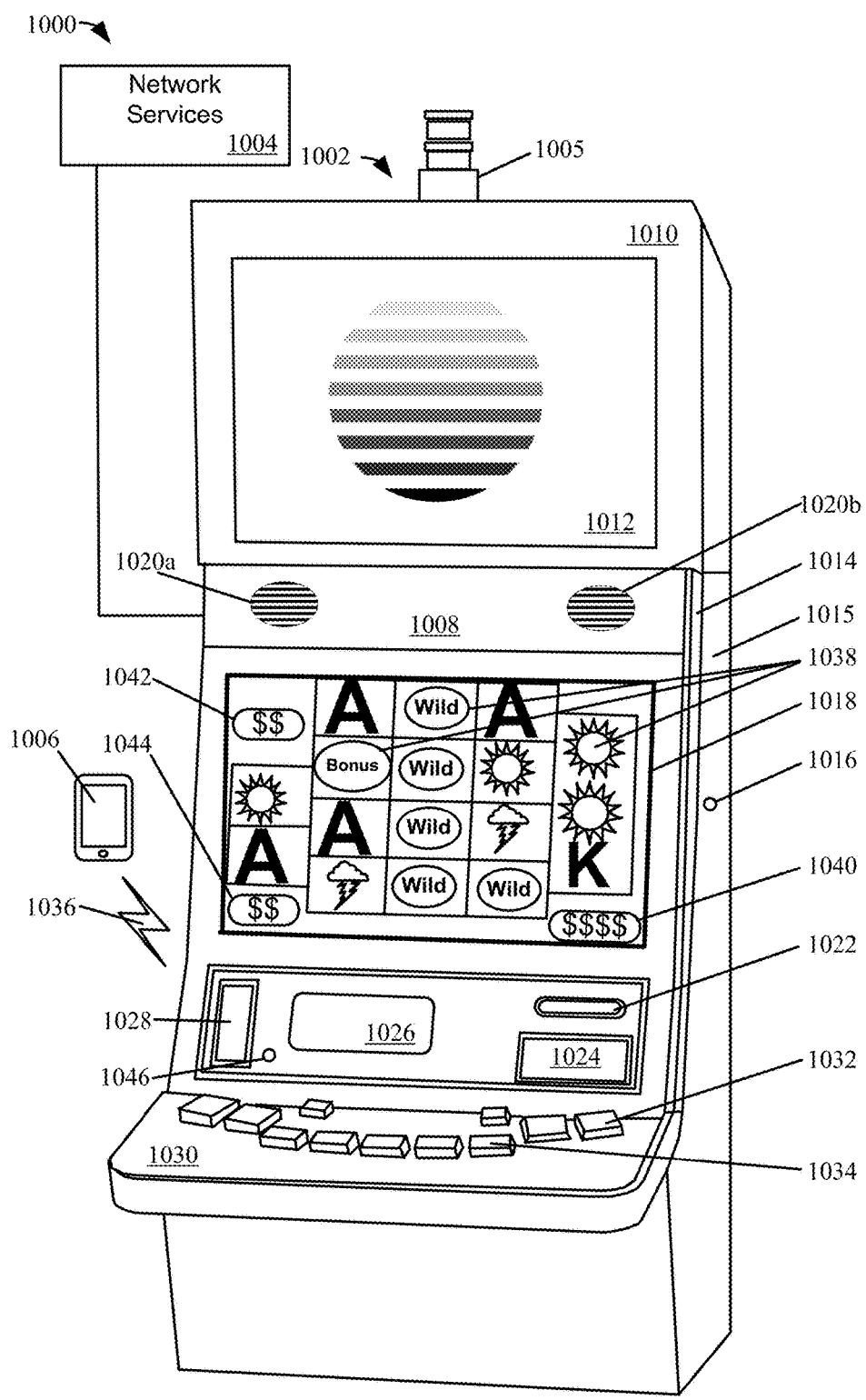
FIG. 1 illustrates a gaming system including a wager-based gaming machine in accordance with embodiments of the present invention.

FIG. 1 illustrates a gaming system 1000 including a wager-based gaming machine 1002. The wager-based gaming machine 1002 can include wireless or wired communication interfaces which allow communications with a remote devices providing network services 1004, such as but not limited to a player tracking system or a progressive gaming system (Network services are described in more detail with respect to FIG. 2). The player tracking system can be part of a slot accounting system. In addition, the gaming machine 1002 can include wireless communicate interfaces, such as wireless interface 1046, which allow communications with a nearby mobile device, such as a mobile phone 1006 or tablet computer, via a wireless connection 1036. The wireless interface 1046 can employ wireless communication protocols, such as Bluetooth™ or Wi-Fi.

The mobile phone or tablet computer can be utilized by a player or casino operator. A device carried by a player can be configured to perform gaming related functions, such as functions associated with transferring funds to or from the gaming machine or functions related to player tracking. A device carried by a casino operator can be configured to perform operator related functions, such as performing hand pays, responding to tilt conditions or collecting metering related information.

The gaming machine 1002 can include a cabinet 1008 and a top box 1010. The top box is mounted above the cabinet. The top box 1010 includes a display 1012. The display 1012 can be used to display video content, such as game art associated with the game played on the gaming machine 1002. For example, the game art can include an animated wheel. The animated wheel can be configured to spin and to stop to reveal a bonus award. In other examples, the video content can include advertising and promotions.

In alternate embodiments, the top box 1010 can include one or more mechanical devices in addition to the display or in lieu of the display. For example, a mechanical device, such as a mechanical wheel can be mounted to or within the top box 1010. The mechanical wheel can include markings that indicate various bonus awards. The wheel can be spun and stopped at a particular stopping point to reveal a bonus award. In yet other embodiments, the top box 1010 can include a plurality of displays.

The cabinet includes an entry instantiated as door 1014. The door 1014 swings outward and is coupled to a back portion 1015. The door 1014 includes a locking mechanism 1016. During operation, the door 1014 is locked. Typically, unlocking the door 1016 causes the gaming machine 1008 to enter a tilt mode where gaming functions, such as the play of a wager-based game, are not available. This tilt mode can be referred to as a hard tilt.

The cabinet 1008 can include a number of apertures that allow access to a portion of a number of devices which are mounted to the cabinet. These gaming devices can include, but are not limited to display 1018, speaker 1020a, speaker 1020b, a printer 1022, a bill acceptor 1024, a secondary display 1026, a card reader 1028 and a button panel 1030 including buttons 1032 and 1034. As described in more detail below, these gaming devices can be used to generate wager-based game play on the gaming machine 1002.

In particular embodiments, the bill acceptor 1024 can be used to accept currency or a printed ticket which can be used to deposit credits on the gaming machine 1002. The credits can be used for wagers. The printer 1022 can be used to print tickets to transfer credits from the gaming machine 1002. Typically, the tickets can be redeemed for cash or additional game play, such as game play on another gaming machine.

Figure 2:
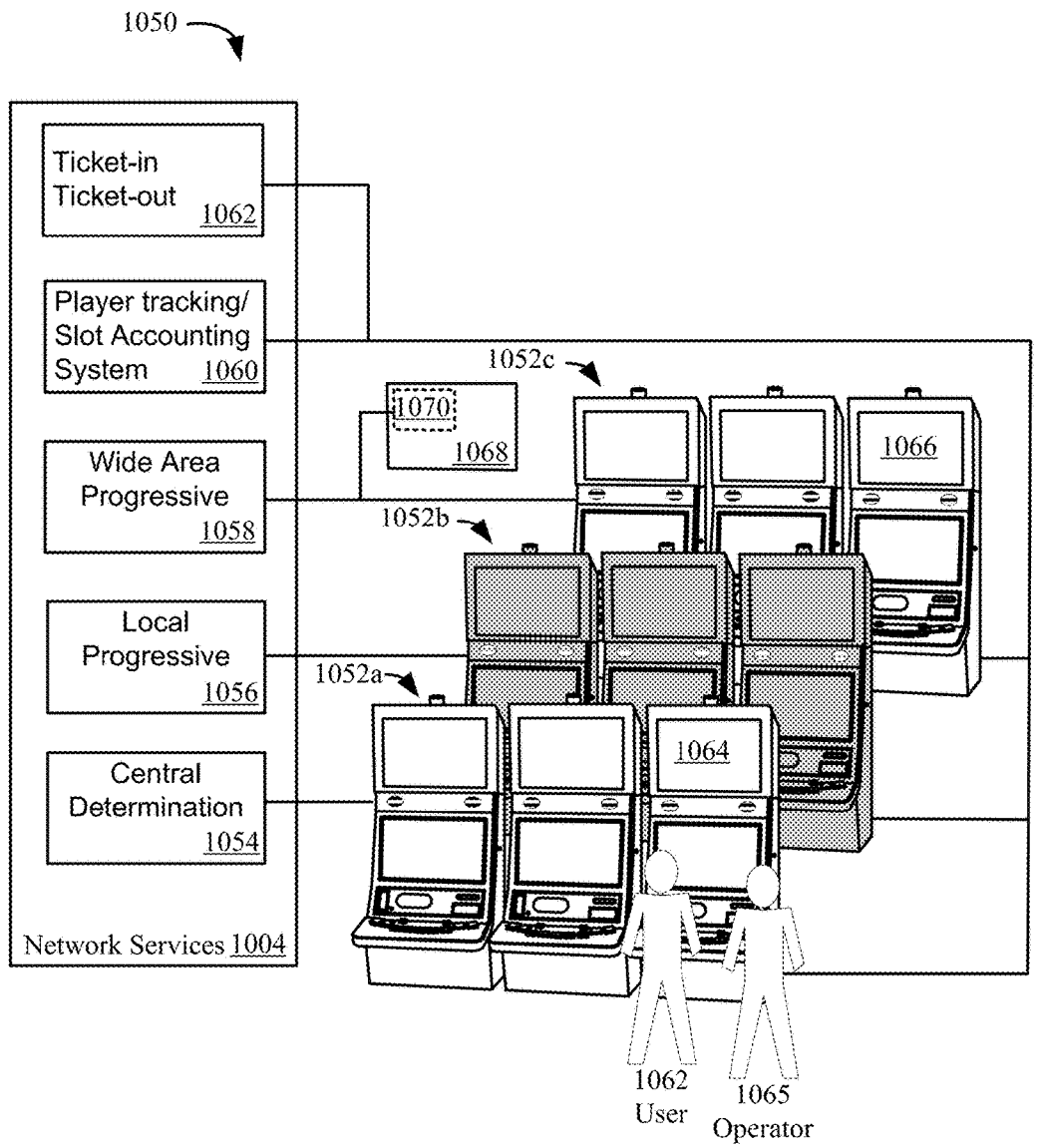
FIG. 2 illustrates a gaming system including three banks of gaming machines in accordance with embodiments of the present invention.

The bill acceptor 1024 and printer 1022 printer can be part of ticket-in/ticket-out (TITO) system 1062 in FIG. 2. The TITO system 1062 can be included in the network services 1004. The TITO system allows a ticket printed at a first gaming machine with a credit amount to be inserted into a bill acceptor at a second gaming machine and validated for game play. After validation, the credit amount associated with the ticket can be made available for game play on the second gaming machine. Additional details of the TITO system 1062 are described with respect to FIG. 2.

The bill acceptor 1024 can include a slot surround by a bezel which allows banknotes of various denominations or printed tickets to be inserted into the bill acceptor. The bill acceptor 1024 can include sensors for reading information from the banknotes and determining whether the banknotes inserted through the slot are valid. Banknotes determined to be invalid, such as damaged or counterfeit notes, can be ejected from the bill acceptor 1024. In some instances, the bill acceptor 1024 can include upgradeable firmware and a network connection. Via the network connection, new firmware, such as new counterfeit detection algorithms can be downloaded to the bill acceptor 1024.

The bill acceptor 1024 includes mechanisms for guiding the banknotes or printed tickets past the internal sensors. Banknotes or printed tickets which are accepted can be guided to a bill stacker (not shown) located within the cabinet 1008 of the gaming machine 1002. The bill stacker can hold a maximum number of bank notes or printed tickets, such as up to two thousand.

The gaming machine 1002 can include a sensor for detecting a fill level of the bill stacker. When the bill stacker is full or close to being full, the gaming machine 1002 can be placed in a tilt mode. Next, the cabinet door 1014 can be opened and the full bill stacker can be replaced with an empty one. Then, the door 1014 can be closed and the gaming machine 1002 can be restored to an operational mode in which it is available for game play.

One function of the printer 1022 is to print "cash out" tickets. In a "cash out," credits available on the gaming machine can be transferred to an instrument, such as a printed ticket, or electronically transferred to an account for later access. Typically, a "cash out" can be initiated in response to pressing one of the physical buttons, such as 1032 or 1034, or touch screen button output on a display, such as display 1018.

In one embodiment, the printer 1022 can be a thermal printer. The printer can be loaded with a stack of tickets, such as a stack with two hundred, three hundred or four hundred tickets. Mechanisms in the printer can grab tickets from the ticket stack and transport the tickets past the print heads for printing. The ticket stack can be located in an interior of the gaming machine cabinet 1008.

The printer 1022 can include sensors for detecting paper jams and a status of the ticket stack. When a paper jam or low ticket stack is detected, the gaming machine 1002 can enter a tilt mode where game play is suspended. In one embodiment, tower light 1005 can light to indicate the tilt status of the gaming machine 1002. After the tilt condition is cleared, such as by clearing the paper jam or replenishing the ticket stack, the gaming machine 1002 can enter an operational mode where game play is again available.

In particular embodiments, the printer 1022 can be coupled to a gaming machine controller (see 1160 in FIG. 2). The gaming machine controller 1160 can be configured to send commands to the printer which cause a "cash out," ticket to be generated. In addition, the printer 1022 can be coupled to other systems, such as a player tracking system (e.g., 1060 in FIG. 2). When coupled to the player tracking system, commands can be sent to the printer 1022 to output printed tickets redeemable for comps (comps refer to complimentary awards, such as but not limited to free credits, a free drink, a free meal or a free room) or printed coupons redeemable for discounts on goods and services.

In additional embodiments, a wireless interface 1046 can be provided to generate the wireless connection 1036. The wireless connection can be established between the gaming machine 1002 and a mobile device, such as 1006. The wireless connection 1036 can be used to provide functions, such as but not limited to player tracking services, casino services (e.g., ordering drinks) and enhanced gaming features (e.g., displaying game play information on the mobile device). The wireless interface can be provided as a stand-alone unit or can be integrated into one of the devices, such as the bill/ticket acceptor 1022 and the card reader 1028. In addition, the bill/ticket acceptor 1022 and the card reader 1028 can each have separate wireless interfaces for interacting with the mobile device. In one embodiment, these wireless interfaces can be used with a wireless payment system, such as Apple Pay™ or Google Pay™. The wireless payment system can be used to transfer funds to the gaming machine that can be used for wager-based game play.

The door 1014 can allow access an interior of the cabinet 1008. Via this access, devices mounted to the cabinet, such as display 1018, speaker 1020, bill/ticket acceptor 1022 or printer 1024 can be serviced and maintained. For example, a receptor configured to receive currency and tickets, coupled to the bill acceptor, can be emptied. The receptor is often referred to as a bill stacker. In another example, blank tickets can be added to the printer 1022 or paper jams can be cleared from the printer. When door 1014 is opened, the gaming machine can enter a hard tilt state where game play is disabled.

In addition, a number of devices (not shown) can be provided within the interior of the cabinet 1008. A portion of these devices is not visible through an aperture in the gaming machine cabinet 1008. For example, a gaming machine controller (GMC) which controls play of a wager-based game on the gaming machine can be found within the cabinet 1008. Typically, the gaming machine controller is secured within a separate lockable enclosure. Details of the gaming machine controller are described below with respect to element 1160 in FIG. 3.

As another example, a number of security sensors can be placed within the interior of the cabinet 1008. The security sensors (e.g., see 1140 in FIG. 3) can be configured to detect access to the interior of the gaming machine 1002. For example, the sensors can be configured to detect when the locking mechanism 1016 is actuated, the door 1016 is opened or a locking mechanism associated with the gaming machine controller enclosure is actuated. A power source, separate from an external power supply, such as a battery can be provided which allows the security sensors to operate and be monitored when the external power supply is not connected.

In particular embodiments, the cabinet 1008 can have a sheet metal exterior designed to provide the rigidity needed to support top boxes, such as 1010 and light kits as well as to provide a serious deterrent to forced entry. For example, the sheet metal can be sixteen gauge steel sheet. Additionally, the door, such as 1014, can be backed with sheet steel in the areas around the displays. Other materials, such as wood, wood composites, can be incorporated into the cabinet and the example of sheet metal is provided for the purposes of illustration only.

A speaker, such as 1020a or 1020b, can be protected by a metal screen. In one embodiment, a speaker, such as 1020a or 1020b, can be a subwoofer speaker. In general, a sound system associated with the gaming machine 1002 can include an audio amplifier and one or more speakers of various types, such as subwoofers, midrange speakers and tweeters.

If the main cabinet 1008 is entered, a "DOOR OPEN TILT" can be displayed halting game play and causing a "DOOR OPEN" event to be sent to the slot accounting system in 1004. In one embodiment, this message can be displayed on the main display 1018. These events can also be stored to the power hit tolerant memory. Upon door closure, the "DOOR OPEN TILT" will be replaced with a "DOOR CLOSED TILT" that can clear after the completion of the next game cycle. Additionally, a logic "DOOR OPEN TILT" can occur if the logic door is opened. The logic door is configured to be lockable independent of how the switch wiring is installed. The gaming machine 1002 can be configured to initiate the logic DOOR "OPEN TILT" regardless of whether or not a lock is installed on the logic door.

The displays 1018, 1012 and 1026, the speakers 1020, the printer 1022, the bill acceptor 1024, the card reader 1028 and the button panel 1030 can be used to generate a play of a wager-based game on the gaming machine 1008. Further, the display 1018 can include a touchscreen. The touchscreen can be used to provide inputs used to play the wager-based game. Some examples of wager-based games that can be played include but are not limited to slot games, card games, bingo games and lottery games. The wager-based games are typically games of chance and utilize a random number generator to determine an outcome to the game.

In general, the wager-based games can be classified as Class II and Class III games. Class II games can include bingo, pull tabs, lottery, punch board, tip jars, instant bingo and other bingo like games. Class III games can include but are not limited to slot games, black jack, craps, poker and roulette.

As described above, the wager-based game can be a slot game. The play of the slot game can involve receiving a wager amount and initiating a start of the wager-based game. A selection of a wager amount and a start of the wager-based game can be performed using buttons, such as 1032 and 1034, on button panel 1030. In addition, the button panel can be used to perform gaming functions, such as selecting a number of lines to play in a slot game, selecting the amount to wager per line, initiating a cash-out and calling an attendant. These functions will vary for different types of games.

In some embodiments, a touch screen can be provided over one or more of the displays, such as 1012, 1018 and/or 1026. The combination of the display and touch screen can be used to perform gaming functions that performed using the button panel 1030. Also, display and touch screen can be used to perform operator features, such as providing a game playback or a hand pay.

The play of wager-based game, such as a slot game, can involve making a wager and then generating and outputting a game presentation. The bet amount can be indicated in 1042. The game presentation can include a number of game features that vary from game to game. The game features provide variety in how the outcome to the wager-based is presented. For example, an award to the outcome of the game can be presented in a series of steps that vary from game to game. In some instances, a portion of the total award for a game can be awarded in each step. The steps and their graphical presentation can be referred to as game features. In various embodiments, information associated with one or more of the steps can be stored to a power hit tolerant memory. The power hit tolerant memory is discussed in more detail with respect to FIG. 2.

As an example, a portion of a slot game outcome presentation is shown on display 1018. The slot game outcome presentation can include displaying a plurality of symbols, such as 1038. During the game outcome presentation, the symbols can appear to move on the display 1018. In addition, symbols can move off the display and new symbols can appear on the display.

Different combinations of symbols can appear on the display for some period of time, which varies for each instance of the wager-based game that is played. At the end of the presentation, the symbols reach a final position and an award associated with the game outcome is presented on the display. The total award for the game can be indicated in 1044 and the total credits available on the gaming machine after the award can be indicated in 1040.

In particular embodiments, a portion of the award to the outcome of the game can be presented as a bonus game. The portion of the award can be referred to a bonus award. The presentation of the bonus award can also be presented in steps where a portion of the bonus award is awarded in each step. These steps can be referred to as bonus game features. In some embodiments, information associated with the steps in the bonus game can be stored to the power hit tolerant memory. In various embodiments, components of the bonus game presentation can be presented on one or more of display 1018, 1012 and 1026.

Next, with respect to FIG. 2, further details of the network services 1004 and gaming machine operations are described. In FIG. 2, another embodiment of a gaming system 1050 is shown. Gaming system 1050 includes three banks of gaming machines, 1052a, 1052b and 1052c. For the purposes of illustration, three gaming machines are shown in each bank.

The network services 1004 includes a central determination server 1054, a local progressive server 1056, a wide area progressive server 1058, a player tracking/slot accounting system server 1060 and ticket-in/ticket-out (TITO) server 1062. In gaming system 1050, all of the gaming machines in each bank, 1052a, 1052b and 1052c, are connected to the slot accounting system server 1060 and the TITO server 1062. However, only the gaming machines in bank 1052a are connected to the central determination server 1054. Further, only gaming machines in bank 1052b and display 1068 are connected to the local progressive server 1056. Finally, only the gaming machines in bank 1052c are connected to the wide area progressive server 1058. The communication connections between the gaming machines in each bank and the servers 1054, 1056, 1058, 1060 and 1062 can be wired connections, wireless connections or combinations thereof.

In various embodiments, the central determination server 1054 can be used to generate a portion of the game played on the gaming machines in bank 1052a. For example, the central determination server 1054 can be used to generate random numbers used to determine outcomes to the games played in bank 1052a. In another example, the central determination server 1054 can be used to generate all or a portion of the graphics used to play the games on the gaming machines in bank 1052a. For instance, the central determination server 1054 can be configured to stream a graphical presentation of a game to a gaming machine, such as 1064. The graphical presentation can be output to a display on the gaming machine.

In one embodiment, the central determination server 1054 can be used to generate numbers used in a bingo type games played on the gaming machine in bank 1052*a*. These bingo type games are often referred to as class II games whereas traditional slot machines are referred to as class III games. In class II games, a draw of numbers is made. The numbers can be mapped to a bingo card, which the player purchases to play the bingo game. The draw of numbers can result in at least one winning game combination on the bingo cards participating in the current bingo game.

The central determination server 1054 can be configured to repeat the number draws for the bingo games at regular intervals. For example, number draws can be repeated every 20 milliseconds. Players at the various gaming machines coupled to the central determination server 1054, such as the players at the gaming machine in bank 1052*a*, can initiate bingo games which utilize the bingo numbers from a particular bingo number draw. The bingo numbers in the number draw can be mapped to a bingo card displayed on the screen of the gaming machine, such as 1064.

Wins can be indicated by a winning pattern on the bingo card, such as four in a row or four corners. In response to a winning pattern on a bingo card on a particular gaming machine, the central determination server 1054 can send a prize amount associated with the win to the gaming machine with the winning pattern. This prize amount can be displayed on the gaming machine and the credits associated with the prize amount can be deposited on the gaming machine. For example, win of a bingo game on gaming machine 1064 can result in a prize amount being displayed on the main display. Further, the prize amount can be deposited as credits on the gaming machine 1064 such that the credits are available for additional game play.

In one embodiment, the prize amount can be output to look like a slot game. For example, if the prize amount is ten credits. Video reels can be displayed spinning on a main display of the gaming machine and a reel combination associated with a ten credit win in a slot game can be output to the display screen. If the outcome to the bingo game on a particular gaming machine is no award, then the video reels can be displayed spinning and a reel combination associated with no award in the slot game can be displayed on the gaming machine. This process can be repeated on various participating gaming machines, as number draws for various bingo games are initiated and completed on the central determination server 1054.

The local progressive server 1056 can be used to generate one or more progressive prizes that are limited to a local group of gaming machines, such as only the gaming machines in bank 1052*b*. When games are played on the gaming machine in bank 1052*b*, an amount of each wager can be contributed to one or more progressive prizes. The local progressive server can receive the contribution amounts from the gaming machines linked to the progressive game and can keep track of the prize amounts associated with the one or more progressive prizes. The prize amounts for the one or more progressive prizes can be output to displays on the participating gaming machines as well as to separate displays near the participating gaming machines.

The local progressive server 1056 can be configured to receive information regarding gaming events on the participating gaming machines. For example, the local progressive server 1056 can be configured to receive a notification from each of the participating gaming machines when a game outcome has occurred associated with a win of a progressive prize. In other examples, the local progressive server can be configured to receive gaming information, such as when each game is played on one of the participating gaming machines, an amount of wagered for each game and when one or more type of game outcomes occur on each of the gaming machines.

The gaming information associated with gaming events on the one or more gaming machines can provide a basis for additional bonus scenarios. For example, a bonus award can be triggered on one of the gaming machines after a random number of games are played on the gaming machines as a group. As another example, a bonus award can be triggered on one of the gaming machines after a particular game outcome occurs a random number of times on the participating gaming machines as a group, such as a particular combination of symbols appearing a random number of times.

The wide area progressive server 1058 is connected to the gaming machines in bank 1052*c* and display 1068. The wide area progressive server 1058 can be used to enable a progressive game played on gaming machines distributed over a wide area, such as multiple casinos distributed within a state. Similar to the local progressive server 1058, when wagers are made, the wide area progressive server 1058 can receive contributions to the progressive prize from the participating gaming machines. The wide area progressive server 1058 can report these contributions to a remote device which tracks the total progressive jackpot. Further, if a progressive jackpot is won on one of the gaming machines to which it is connected, the wide area progressive server 1058 event can be reported to the remote device. Yet further, the wide area progressive server 1058 can receive a current progressive jackpot amount from the remote device. The current progressive jackpot amount can be reported on displays on the gaming machines participating in the progressive jackpot and/or nearby signage, such as 1068.

The display 1068 can have a digital sign controller 1070. The digital sign controller 1070 can have a network interface which allows it to communicate with a remote device, such as the wide area progressive server 1058. In this example, the digital sign controller 1070 can be configured to output information to display 1068 associated with the progressive game, such as a current jackpot amount.

In general, displays with digital sign controllers can be provided through out a gaming environment, such as casino. The digital sign controller, such as 1070, can be configured to communicate with a remote device. The remote device can be configured to send information to the digital sign controller to output to a display. The information can include video, audio and picture data. Further, the remote device can be configured to send commands to the display, such as a command to output information to the display.

The slot accounting system portion of server 1060 can receive accounting information from each of the gaming machine in system 1050, such as an amount wagered for each game and amounts awarded on each gaming machine. The server 1060 can also receive information which uniquely identifies each gaming machine including a machine ID number and a current game being played on the gaming machine. The accounting information can be used for auditing purposes.

The player tracking system portion of server 1060 can track the game play of individual users. For example, a player can input account information into one of the gaming machines that is associated with a player tracking account that has been previously set-up. Based on the account information, a particular player tracking account can be located. The player tracking account can include information which identifies an individual user, such as user 1062

(User 1062 can be playing games at one of the gaming machines in bank 1052*a*.). The player tracking account information can include a player's name, address, phone number, gender, etc.

In one embodiment, a player, such as user 1062, can insert a player tracking card in a card reader (e.g., see card reader 1022 in FIG. 1). The card reader can read player tracking account information from the player tracking card, such as on a magnetic strip on the card, and send the information to the player tracking/slot account system server 1060. Based upon the received player tracking account information, the player tracking system portion of server 1060 can locate a player tracking account.

The player tracking account information can be input via other means on the gaming machine. For example, as shown in FIG. 1, the gaming machine 1002 may be able to communicate with a mobile device, such as 1006. Thus, in one embodiment, the gaming machine 1002 may be configured to directly receive player tracking account information from a mobile device. In another embodiment, the gaming machine 1002 may be configured to generate an input interface on a touch screen display that allows a player to input player tracking account information.

After the player provides account information and an account is located, the player tracking system can enter accounting information associated with a player's game play into the identified player tracking account, such as an amount wagered over time. As described above with respect to FIG. 1, the accounting information associated with a player's game play can provide a basis for awarding comps to the player. For example, based upon a player's previous game play, the player tracking system portion of server 1060 can send an amount credits to the gaming machine on which the player is playing. In another example, the player tracking system portion of server 1060 can send a command to a printer (e.g., see 1022 in FIG. 1) on the gaming machine on which the player is playing to print out a ticket. The ticket can be redeemable for goods or services or a discount on goods or services, such as a free meal or discount a meal.

As described above, each of the gaming machines can be coupled to a ticket-in/ticket out (TITO) server 1062. TITO server 1062 can be used to generate and validate instruments associated with a credit and/or cash value. One example of an instrument, which can be generated and validated, is a printed ticket. Another example is a digital instrument, such as a printed ticket stored in a digital form. In one embodiment, a digital instrument can be stored on an electronic device carried by a user, such as a mobile device carried by user 1062.

As an example, when a printer, such as 1022, is employed in a "cash out," the gaming machine controller (e.g., see 1160 in FIG. 3) can contact a TITO server (e.g., see 1062 in FIG. 2) with a cash out amount. In response, the TITO server can generate a unique number, associate the unique number with a value and send the gaming machine a unique number. The unique number can be sent to a printer (e.g., see printer 1022 in FIG. 1). Then, the printer can print a ticket with the unique number, such as a unique number encoded in a bar-code, and a value of the ticket, such as five dollars.

When the ticket is later presented for redemption, the unique number can be used to validate the ticket. For example, the user 1062 can "cash out" at a first gaming machine, such as 1064 in bank 1052*a*, and receive a printed ticket with a unique number generated by the TITO server 1062. Then, the user 1062 can go to a gaming second gaming machine, such as 1066 in bank 1052*c*, and insert the ticket into a bill acceptor (e.g., see 1024 in FIG. 1). The second gaming machine 1066 can contact the TITO server 1062 and send the ticket information, i.e., the unique number read from the ticket, to server 1062. Then, the server 1062 can validate the ticket and send back to the second gaming machine 1066 an amount of credits to deposit on the second gaming machine. The deposited credits can be used for additional game play.

In these examples, the servers can include processors, memory and communication interfaces. Various gaming functions are associated with each of the servers, 1054, 1056, 1058, 1060 and 1062. The described distribution of gaming functions is for the purposes of illustration in only. In alternate embodiments, combinations of gaming functions can be combined on the same server or repeated on different servers. For example, the central determination server 1054 can also be configured to provide a local progressive to the bank of gaming machine 1052*a*. In another example, the local progressive server 1056 can be configured to provide a number of different progressive prizes for different groups of gaming machines. In yet another example, the player tracking system portion of server 1060 can be configured to provide bonusing features at each of the gaming machines.

In FIG. 2, while gaming machines, such as 1064 or 1066, are operational, a user 1062 can engage in game play. Under some conditions, such as tilt conditions, game play can be suspended and an intervention by an operator, such as 1064, may be required. An operator intervention may require an operator, such as 1065, to be directly present at a gaming machine, such as 1064. For example, the presence of an operator may be required to access an interior of the gaming machine to clear a tilt condition. In other examples, an operator may be able to clear a tilt condition from a remote location via a communication connection with the gaming machine.

In one embodiment, during game play, the gaming machine can award an amount above some threshold amount. Prior to receiving the award, an operator, such as 1065, can be sent to the gaming machine to have the player fill out a form for tax purposes. In the United States, this tax form is referred to as a W2G form. In addition, the operator may verify that the gaming machine was operating properly when the award was made prior to the player receiving the award. For example, if the gaming machine indicates a progressive jackpot has been won, the operator may check to verify the gaming machine was operating properly. In a hand pay, the operator, such as 1064, may provide an instrument redeemable for the jackpot amount.

As described above and in more detail with respect to FIGS. 1, 3 and 7, an operator, such as 1064, may be required to be physically present at a gaming machine, such as 1064 and 1066, to clear a tilt condition. For example, to clear a tilt condition, the operator, such as 1065, may have to access an interior of a gaming machine to clear a paper jam in a printer or a bill acceptor (e.g., see printer 1022 and bill acceptor 1024 in FIG. 1). In another example, to clear a tilt condition, the operator 1065 may have to access an interior of the gaming machine, such as 1064, to add more tickets to a ticket printer or empty a note stacker associated with the bill acceptor. For some tilt conditions, the gaming machine operator 1064 may access a menu output on a main display of the gaming machine, such as 1064 or 1066, to perform a RAM clear. RAM clears are described in more detail below with respect to FIG. 3.

Figure 3:
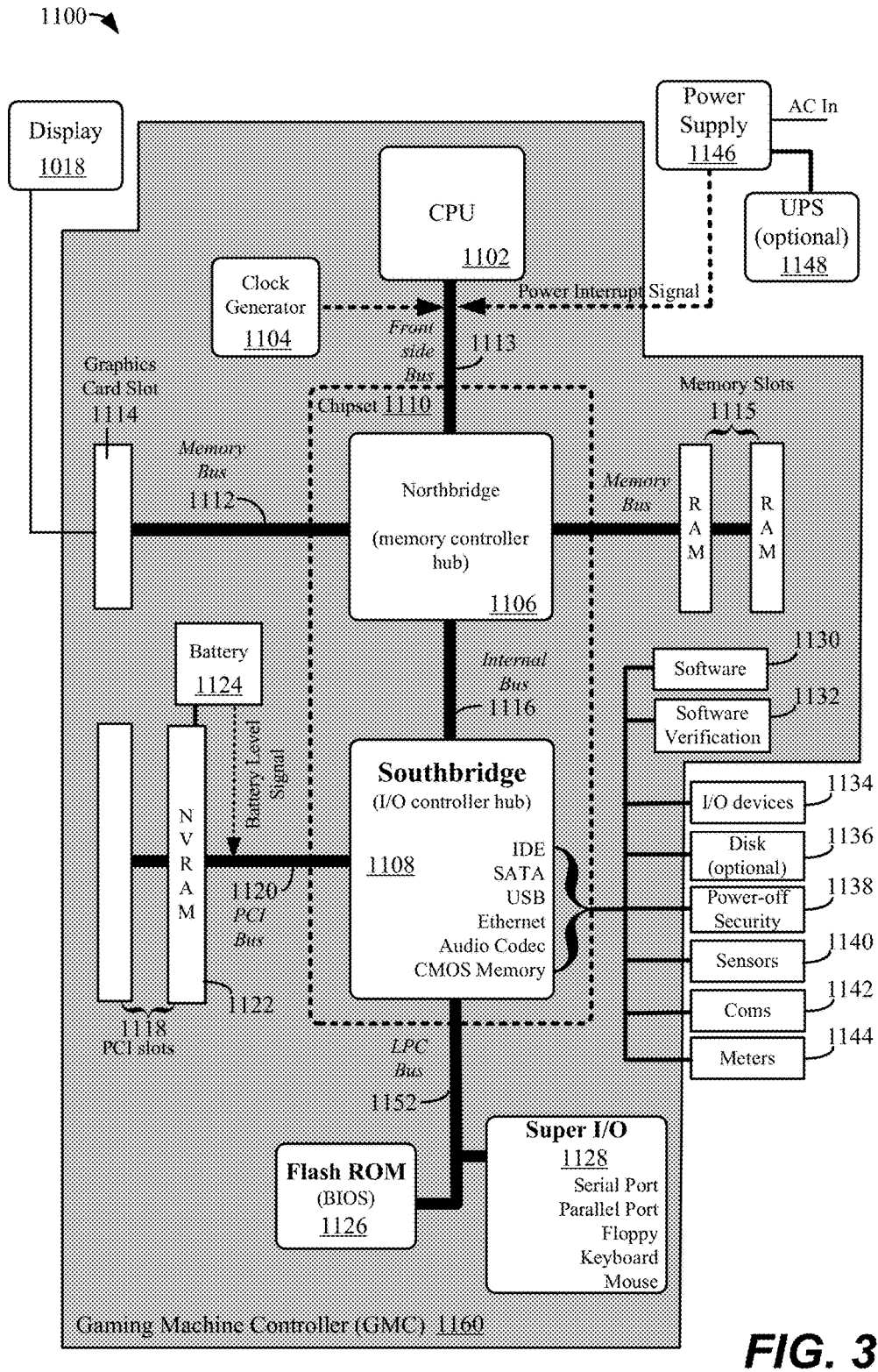
FIG. 3 illustrates a block diagram of gaming machine components including a gaming machine controller in accordance with embodiments of the present invention.

Next, details of the gaming machine controller that is used to control the play of the wager-based game including generating the game presentation and controlling the various gaming devices is described with respect to FIG. 3. FIG. 3 illustrates a block diagram of gaming machine components including a gaming machine controller (GMC) 1160. The GMC 1160 can be coupled to a power supply 1146, display 1018, I/O 1134 devices, external memory, such as a disk drive 1136, a power-off security device 1138, security sensors 1140, communication interfaces 1142 and meters 1144.

The power supply 1146 can provide a DC voltage to the GMC 1160. The power supply can also provide power to the other devices in the gaming machine cabinet, such as I/O devices. Typically, the power supply 1146 is configured to receive power from an external power source, such as an AC voltage source. The power supply converts the AC voltage to a DC voltage. In some embodiments, an uninterruptable power supply (UPS) 1148 can be coupled to the power supply 1146. The UPS 1148 can be configured to provide back-up power for some time period in the event external power is lost.

In a particular embodiment, the UPS 1148 communicates with the GMC 1160 on boot up and periodically to indicate power status and battery capacity of the UPS. If the UPS 1148 is not operational, this communication will fail and the game will display a soft tilt on the main game display, such as 1018, indicating that the UPS is not available. Under normal circumstances the UPS 1148 functions to condition the input power and ensure that the UPS battery remains fully charged. However, upon a power failure, the UPS 1148 in conjunction with the game platform will take one of two paths depending on the state of the UPS battery, which are described as follows.

If a power fail occurs and the UPS battery is more that 50% charged the GMC 1160 can immediately determine if there are credits on the machine (The threshold level can be a different percentage). If the game has no credits, the GMC 1160 can immediately hard tilt and become unplayable. The GMC 1160 can continue to run on battery power until either the battery level passes below 50% or power is restored to the game. If power is restored, the hard tilt is cleared and the gaming machine can become playable again.

If credits are on the machine, the GMC 1160 can allow game play to continue until the battery level reaches 50% charge. At that point, the GMC 1160 can complete a game in progress, cash out the player and begin an orderly shutdown. Allowing game play prior to shutting down allows the player to complete a game in progress and continue to remain on the game for a small period of time in case power is restored quickly. This keeps the game from tilting and the GMC 1160 cashing out the player for momentary glitches in power. It also allows some time for backup generators to come on line for a more serious power outage.

The power-off security 1138 can be configured to monitor the security sensors 1140 while power is off to the gaming machine, such as during a power failure or shipping. The power-off security 1138 can include its own processor, memory and power supply, such as a battery. The power-off security device 1138 can report detected problems while the power was off to the GMC 1160 after power is restored. In some instances, a detected problem can cause a tilt condition. For example, a detected door open condition while the power was off may cause a tilt condition which has to be cleared by an operator. As another example, if the GMC 1160 can't detect the power-off security 1138, then the gaming machine can tilt.

The I/O devices 1134 can include the gaming devices that provide the external interface that allows the wager-based game to be played on the gaming machine. Examples of these gaming devices are described above with respect to FIG. 1. In some embodiments, a memory device 1136, such as disk drive or flash drive, can be provided. As will be described in more detail below, the memory device 1136 can be used as a power hit tolerant memory (PHTM) or used to receive crucial data from another PHTM.

The communication interfaces 1142 can include wired and wireless communication interfaces, which use communication protocols, such as but not limited to Ethernet, Bluetooth,™ Wi-Fi, and NFC. An example of a wireless communication interface 1046 is shown in FIG. 1. The remote servers can provide network services 1004 as described above with respect to FIG. 1. The communication interfaces can be used to communicate with remote devices, such as remote servers, mobile devices in proximity to the gaming machine or other gaming machines. The GMC 1160 can be configured to support a variety of communication protocols over these communication interfaces.

In one embodiment, communications can be carried out with a back-end slot accounting system (SAS) (e.g., see network services 1004 in FIG. 1). The SAS protocol uses a CRC to ensure the integrity of messages going to and from the host. All type S, M, and G Long polls are CRC'd over the entire package including the address and command byte. The SAS engine can be configured to isolate the gaming code from the external communications. The SAS engine can be configured to only accept correctly formed SAS messages. Malformed, invalid or incorrect messages can be summarily dropped.

Messages that are valid can be translated into requests for the game player. The result of the message translation can be two-fold. First, the message is parsed and then evaluated for correctness and validity. If the message does not meet this criterion, it may not be translated and forwarded to the game player for a response, such as on display 1026 in FIG. 1. Second, no command, request or message from the external communication interface ever reaches any further than the SAS engine. This process ensures that erroneous signals or data will not adversely affect the game.

The meters 1144 can include hard meters, which are mechanical devices and meters maintained in software by the GMC 1160. In one embodiment, electronic digital storage meters of at least 10 digits that accumulate and store all the meters required can be used. For example, the number of games played since RAM clear can be accumulated. In a RAM clear critical memory can be cleared of data. Further, the number of games since the last power-up can be accumulated. As another example, games since the last door close can be accumulated.

Some other functions which may be tracked by a physical or software meter include but are not limited to attendant paid jackpots, attendant paid cancelled credits, bill in, voucher in (e.g., credit voucher), voucher out, electronic fund transfer in, wagering account transfer in, wagering account transfer out, non-cashable electronic promotion in, cashable electronic promotion in, cashable promotion credits wagered, non-cashable electronic promotion out, cashable electronic promotion out, coupon promotion in, coupon promotion out, machine paid external bonus payout, attendant paid external bonus payout, attendant paid progressive payout, machine paid progressive payout, non-cashable promotion credits wagered, number of progressives won, number of jackpots won, number of games won, number of games lost and total amount paid by attendant. Other meters can include main door open, logic door open, cash door open and stacker door open.

In a particular embodiment, software meters can be accessed from an operator menu by turning a key on the side of the gaming machine. The operator menu can be output on display 1150. All software meters can be cleared upon a RAM clear. In addition to the meters, the machine can also display the configured denomination, theoretical payout and actual payout. This information is accessible from the operator menu under the statistics screen. This information can be cleared upon a RAM clear event.

The GMC 1160 is secured within an interior of the gaming machine. The GMC 1160 can be contained in a metal box. The metal box can include an entry, such as a hinged door, that is lockable. The openings for cables and wiring in the metal box can be purposefully designed to be as small as possible while still allowing proper electrical wiring standards regarding bend radius and connector strain. The locking mechanism for the metal box can be monitored by one of the sensors 1140.

The GMC 1160 can include a motherboard. The motherboard can be the only circuit card that contains control programs. Other gaming devices, such as the I/O devices 1134, can include device specific control programs. However, these device specific control programs don't affect or alter the behavior of the control programs on the motherboard.

The mother board can include a chipset 1110. The chipset 1110 can include a northbridge 1106, which is a memory controller hub, and a southbridge 1108, which is an I/O controller hub. The northbridge 1106 and the southbridge 1108 can communicate via an internal bus 1116.

The northbridge 1106 can be coupled to a memory bus 1112 and a front side bus 1113. The front side bus 1113 can couple on or more processors, such as CPU 1102, to the northbridge 1106. The CPU 1102 can receive clock signals from clock generator 1104 via the front side bus 1113.

The memory bus 1112 can couple one or more graphics cards, which include graphical processing units (GPUs), to the northbridge 1106. The graphics card or cards can be installed in the graphics card slot(s). The graphics cards can be coupled to displays, such as display 1018. Further, the memory bus 1112 can couple one or more memory slots 1115, configured to receive volatile random access memory, to the northbridge 1102. The CPU 1102 can communicate with the volatile memory in the memory slots 1115 and the graphics card in the graphics card slot 1114 via the memory bus 1112 and the front side bus 1113.

The southbridge 1108 can be coupled to one or more PCI slots 1118 via PCI bus 1120. In various embodiments, the southbridge 1108 can provide a variety of communications interfaces. The communication interfaces include but are not limited to IDE, SATA, USB, Ethernet, an audio Codec and CMOS memory. In addition, the southbridge can communicate with a flash ROM (BIOS) 1126 and super I/O 1128 via the LPC (Low Pin Count) bus 1152. Typically, super I/O 1128 supports older legacy devices, such as a serial port (UART), a parallel port, a floppy disk, keyboard and mouse. Some of the gaming devices, such as the sensors 1140, can be coupled to the southbridge 1108 via super I/O 1128.

The GMC 1160 can be configured to execute gaming software 1130 to control play of a wager-based game. On boot-up, software verification 1132 can be performed using logic stored on the BIOS 1126. In some instances, the logic can also be executed on the BIOS. In a particular embodiment, separate hardware device can be installed which includes verification algorithms. The separate hardware device can be coupled to the southbridge.

In one embodiment, the gaming software 1130 can be stored on two compact flash cards, which are not conventional ROM devices. The verification mechanism can be an SHA-1 hash, which produces a message digest of some length, such as one hundred sixty bits. Message digests can be stored on both compact flash memories and a public/private key algorithm with a key of some length, such as a 512-bit key, can used to encrypt and decrypt the message digests. If any errors are detected in the validation, the GMC 1160 can tilt and halt execution. The GMC 1160 can be configured to prevent programs deemed to be invalid from running.

When the software 1130 is built, it can be hashed using a hash algorithm, such as an SHA-1 hash algorithm. Other hashing algorithms can be used and SHA-1 is provided for illustrative purposes only. The resulting hash answers can form the hash digest. This digest, along with the start and stop values for the validation algorithm, can be encrypted a private key. The key can be stored in a computer which is not connected to any network and which is physically stored in a secure location, such as a locked safe.

In one embodiment, prior to use, the public key can be installed in a power-hit tolerant memory, such as the NVRAM 1122 on the motherboard. This step can be performed when the gaming machine is manufactured. In another embodiment, the public key can be loaded from a memory device, such as a USB device, in the field. In one embodiment, the USB port is only accessible when the enclosure which holds the GMC 1160 is opened. Without a proper public key, the machine will not operate.

When the game initially powers up, the BIOS 1126 can run a Power On Self-Test (POST) and checksum over itself. If these tests fail, the game does not boot and an operator can be required to clear this tilt. If the BIOS self-test passes, the BIOS can retrieve the public key from NVRAM 1122 and can run a CRC over it to ensure it is the correct key. The correct CRC answer can be stored on the BIOS. If the public key does not exist or if the public key CRC returns an incorrect answer, the game can halt and prompt the user to install the correct public key.

Once the public key is validated, the BIOS 1126 can decrypt the SHA signatures for the data stored on the system compact flash 1130 and the start and stop sectors indicating where the data is stored on the compact flash. The data can be stored between the start and stop sectors, inclusive. Unused sectors can be set to 0 (zero). The BIOS 1126 runs a low-level block-by-block SHA-1 hash over the kernel and operating system (Boot and Root) partitions and compares the result to the decrypted file from the manifest. In one embodiment, the operating system can be Linux and the kernel can be a Linux kernel. If the hash values do not match, the game tilts.

If the values match, the BIOS 1126 can load the boot loader program and can relinquish control of the validation process to the boot loader. The boot loader can be executed by the operating system using CPU 1102. The procedure can validate the entire partition, not just the file structure. Thus any unused or unallocated areas of the partition can be tested for unintended programs or data.

Next, a file-by-file SHA-1 can be performed over the paytable, assets, and player files. The resulting information can be compared against the decrypted results from the manifest file. If the calculated answers match the decrypted answers, the GMC will proceed with the boot-up. If the hash answers do not match, the game tilts and requires operator intervention to clear.

In one embodiment, as an additional security measure, a compressed file system that is designed to be read-only can be used. The file system may not support or contain a write command or the ability to write to a file. The file system can be compressed so that it is not human-readable.

Each block of data in the file system can have a corresponding CRC stored with the block. When the block is read, the CRC is calculated and compared with the stored CRC. If the answer does not match, the file system can generate an error and the game tilts. Any changes, whether additions, deletions, or modifications, will change the CRC of the affected blocks and cause the game to tilt. This feature, in effect, monitors the integrity of the entire file system as well as the integrity of the media on a real-time basis.

These SHA hash answers can be available on-screen and may also be accessed via the Gaming Authentication Terminal (GAT) interface. The GAT interface (not shown) can be provided as one of the I/O devices 1134 or within the super I/O 1128. The GAT interface can be configured to allow an operator to initiate an SHA-1 hash or an HMAC SHA-1 on-demand so that an operator (or other independent entity) can validate the integrity of the software 1130 at any time. In one embodiment, a nine-pin "D" connector is available to an operator or regulator for access the GAT serial terminal.

Access to the GAT port requires opening of the main door. Further, it may require unlocking of the GMC enclosure. In one embodiment, a GAT port can be provided on the outside of the GMC enclosure. Hence, the GMC enclosure can remain locked while the GAT port is utilized.

As described above, the gaming machine can include a power hit tolerant memory (PHTM). For example, NVRAM 1122 coupled to battery 1124 can be used as a PHTM. The PHTM can be used to store crucial data, such as data generated during the play of a wager-based game. The PHTM can be configured to be able to quickly write the crucial data in response to a detection of an imminent power interruption. The CPU 1102 can be configured to detect a potential power interruption via the power interruption signal received from the power supply. The power interruption signal can indicate a fluctuation in the power.

Not all memory types are suitable for use as a PHTM because their write times are not fast enough to store data between the detection of a potential power interruption and the power interruption. For example, disk drives don't typically have fast enough write times for use as a PHTM. In one embodiment, a disk drive 1136 can be used. However, it requires that use of an uninterruptable power supply coupled to the disk drive 1136 and GMC 1160 to maintain power after the external AC power source is lost. Other types of memory with slower write times can be employed when an uninterruptable power supply is used.

Typically, a volatile RAM (random access memory) has a fast enough write speed to be used as a PHTM. However, after the power is lost, data stored in the volatile RAM is lost. To overcome this deficiency, a battery, such as 1124, can be coupled to the RAM 1122 to provide persistence memory storage. This memory configuration can be referred to as a non-volatile RAM (NV-RAM). The battery power levels can be monitored so that it can be replaced as needed.

In one embodiment, an NVRAM 1122 with a battery 1124 is shown inserted in one of the PCI slots 1118. The NVRAM 1122 can be used as a PHTM. In other embodiments, it may be possible to use a RAM inserted into one of the memory slots 1115 that is coupled to a battery. It yet another embodiment, it may be possible to use a high-speed USB connection to a memory storage device to provide a PHTM. As noted above, a hard disk, such as 1136, in combination with an uninterruptable power supply 1148 can be used as a PHTM.

In yet other embodiments, a GMC 1160 may utilize multiple memory storage devices to store crucial data. For example, the NVRAM 1122 can be used as a PHTM. However, crucial data can be copied to a non-PHTM from the NVRAM 1122 as needed. The copied data can provide a back-up of crucial data stored in the PHTM. Further, after crucial data is copied from the PHTM and the validity of the crucial data is verified, it may be deleted from the PHTM to free up space.

In one embodiment, crucial data can be stored in an NVRAM chip and in a high speed read/write compact flash. Crucial data such as RNG outcome, game recall, game state (credits, wager, winnings), and meters can be stored in NVRAM as files. Each file is hashed (MD5 or SHA-1 depending on the file) and the hash answer can be stored with the file.

Additionally, in a particular embodiment, in NVRAM, the critical files can be kept in triplicate with each copy having a separate MD5 hash of the information. Prior to displaying each game outcome, this data can be rehashed and the three outcomes can be compared. If all three hash answers match, the data is deemed to be good and the game results are displayed to the player and a copy is stored in NVRAM. If two of the sets match, the non-matching set is deemed to be corrupt and it is replaced with a copy from one of the other two and the results are displayed to the player. If all three are different, memory can be deemed to be corrupt and a tilt can occur, halting play. The comparisons can occur continuously, each time the memory is updated, which may be multiple times during the course of a single play. However, a comparison can be performed at least once prior to displaying the game outcome.

To protect meters in the event of a power loss, various meters can be stored in NVRAM 1122. Thus, the meters are protected in the event of a power loss. The battery 1124 can be a lithium cell rated, based on the current draw of the NVRAM, to maintain the meters for at least 90 days. In one embodiment, the lithium cell can be rechargeable via the power supply 1146.

In particular embodiments, a game play history associated with recent games can be stored in the NVRAM 1122. This information can be retrieved from the NVRAM 1122 via an operator menu and output to a display, such as display 1018. In particular embodiments, a complete play history for the most recent game played and the nine prior games can be made available. A method involving game play history is described in more detail with respect to FIG. 11.

For a slot game, the game play history can include credits available, credits wagered, number of lines played (when appropriate), bonuses won, progressive won, game winnings (credits won) and credits cashed out. For "pick" bonuses, the intermediate steps involving the player picks can be retained. In games with free spins, the initiating game is retained with all or, for cases where more than fifty free games have been awarded, at least the last fifty free games played. This gaming information can be displayed in the recall screens through standard text meters, screen shots, graphical display elements and textual representations of specific situations that occurred during game play. The game play history can illustrate unique game play features associated with the game in general and specific game features that occurred during the instantiation of a particular play of the wager-based game.

FIGS. 4A and 4B illustrate a front view 1002b and side view 1002c of the gaming machine 1002 in FIG. 1. The gaming machine 1002 can include a cabinet 1008 with a front face 1008a, sides 1008b and 1008c, a top 1008d, a back face 1008e and a bottom 1008f. A candle 1005 is mounted to the top 1008d of the gaming machine 1002. An air filtration and cooling system 100 disposed within an interior of the cabinet 1008.

In one embodiment, the air filtration and cooling system 100 can include an enclosed channel for passing filtered air through an interior portion of the cabinet 1008 of the gaming machine 1002. The channel can be referred to as a plenum 102. The air can be filtered to remove particulate matter and resins associated with cigarette smoke. Then, for cooling purposes, the filtered air can pass over hot components disposed within the plenum 102. The hot components and their location in the plenum 102 are described in more detail with respect to FIGS. 5A, 5B and 5C.

In more detail, outside air, which is typically cooler than air within an interior of the cabinet 1008, can enter the cabinet 1008 through a first vent, flow through the interior of the cabinet 1008, via the plenum 102, to cool one or more electrical components disposed within an interior of the plenum 102. The air can be heated by the electrical components. Then, the heated air can exit the cabinet through a second vent.

In one embodiment, the plenum 102 can have a horizontal 102a and vertical portion 102b. Cooler outside air 105a can enter the horizontal portion 102a of plenum 102 through a vent in the side 1008c of the cabinet 1008. In one embodiment, as described with respect to FIGS. 5A-6B, electrical components, which heat up during operation of the gaming machine, can be located in the horizontal portion 102a of the plenum 102. Thus, the air 105b can flow through the horizontal portion 102a of the plenum 102 and pick up heat from the electrical components. Next, the heated air 105c can enter into the vertical portion 102b of the plenum 102. Finally, the heated air 105d can exit the vertical portion 102b of the plenum 102 through a vent in the top 1008d of the gaming machine cabinet 1008.

In this example, as shown in FIG. 4A, the horizontal portion 102a of the plenum 102 is positioned behind display 1018. The vertical portion 102b of the plenum 102 extends upwards from behind display 1018, behind a front portion 1008a of cabinet 1008 of gaming machine 1002 and behind display 1012. The plenum 102 can be mounted to an interior back face 1084 (See FIG. 5A) of the cabinet 1008.

In one embodiment, the horizontal portion 102a of the plenum 102 can have a cross section which is about 12 inches high and six inches deep. The vertical section 102b of the plenum can have a similar cross section or a different cross section. For example, the cross sectional area of the vertical portion 102b of the plenum 102 can be smaller than the cross sectional area of the horizontal portion 102a of the plenum 102.

In alternate embodiments, the plenum 102 can be disposed in different portions of the cabinet 1008. For example, the horizontal portion 102a of the plenum 102 can be disposed beneath button panel 1030. In another embodiment, a vent for air to enter the plenum doesn't have to be on the side 1008c of the gaming machine cabinet 1008. For example, a vent can be provided on the back face 1008e of the cabinet 1008, opposite the front face 1008a. The vent on the back face can allow generally cooler outside air 105a to enter the plenum 102. As another example, a vent can be provided on the bottom 1008f of the cabinet 1008 (assuming a space between the bottom of the cabinet and the floor), such that air enters into the plenum 102 from underneath the cabinet.

In yet another embodiment, the vertical portion 102b of the plenum 102 doesn't have to extend to a top 1008d of the gaming machine. For example, the vertical portion 102b of the plenum can extend only partially up the back side 1008e of the cabinet 1008. Then, the air 105d can exit the plenum 102 through a vent in the back side 1008e of the cabinet 1008 instead of through the top 1008d of the cabinet 1008.

In yet another embodiment, the plenum 102 may only include a horizontal portion 102a. In this instance, a vent can be provided on a side 1008b of the cabinet or on the back 1008e of the cabinet 1008 to allow to flow through the horizontal portion 102a of the plenum 102 and exit the cabinet. One benefit of providing a vertical portion 102b of the plenum 1002 is that hot air rising through the vertical portion can provide a chimney effect, which helps to pull air through the plenum 102 using convection. Without a vertical portion 102b of the plenum 102, this effect would be minimized.

Next, with respect to FIGS. 5A, 5B and 5C, additional details of the air filtration and cooling system 100 are described. FIG. 5A illustrates a top view 1002d of a cabinet 1002. FIG. 5B illustrates a view of the interior back side 1084 of the cabinet with a front face 1008a and sides, 1008b and 1008c of the gaming machine cabinet 1008 removed. FIG. 5C illustrates a side view 1002e of a gaming machine 1002 showing the side 1008c of cabinet 1008. The disposition of the air filtration and cooling system 100 including the plenum 102 within the cabinet 1008 is shown.

In FIGS. 5A, 5B and 5C, in one embodiment, the air filtration and cooling system 100 includes the plenum 102, a fan 110, a first stage filter 106 for trapping particulate matter, a second stage filter 108 for the absorption of the oils emitted by cigarette smoke, vents 116 and 118, temperature sensors 112a and 112b, air quality sensors 114 and 118, and gaskets 122 and 124. As shown in FIG. 5B, for heat dissipation purposes, a game controller 1160 and the power supply 1146 are located within plenum 102. The power supply converts AC in to DC out. The conversion process can generate heat.

In another embodiment, the power supply 1146 may be located outside of the plenum 102. If desired, additional electrical components (not shown), which generate significant heat and need cooling, can be located within the plenum 102. Alternatively, the plenum 102 can limit access to electrical components disposed within it. Thus, electrical components can be secured within the plenum 102 for security purposes and not just cooling purposes.

In one embodiment, the game controller 1160 and power supply 1146 can be mounted to the back interior wall 1084 of the cabinet 1002. The back interior wall 1084 can form a back side of the plenum 1002. The remaining sides of the plenum 1002, such as a front side, a top side and a bottom side, can be formed from a material, such as sheet metal, and secured to the back interior wall 1084 of the cabinet 1008.

In another embodiment, the plenum 102 can be formed as a conduit from material, such as sheet metal. The conduit can be secured within the interior of the cabinet, such as mounted to the interior back wall 1084. The conduit can include one or more openings which allow components, such as the game controller 1160 and the power supply 1146, to be mounted within the conduit. After the components are mounted within the conduit, the openings can be covered to prevent air from escaping from or entering the conduit via the openings. The conduit can be formed other materials, such as wood, or a composite material and the example of sheet metal is provided for the purposes of illustration only.

As shown in FIG. 5B, one or more filters, such as 106 and 108, can be associated with the air filtration and cooling system 100. The one or more filters can be positioned to allow air which enters from outside of the cabinet to pass through the filters prior to reaching the electrical components, such as 1160 and 1146. The air from outside the cabinet can be filtered to prevent potentially damaging particulates and gaseous compounds in the air from reaching the electrical components.

As an example, the first filter 106 and the second filter 108 can be placed near the entrance to the plenum 102 within the interior of the cabinet 1008 which is adjacent to the side 1008c of the gaming cabinet 1008. The filters can be ordered such that air passes through the first filter and then the second filter 108. As described above, the air can include contaminants resulting from cigarette smoke. Thus, the first filter 106 and the second filter 108 can be configured to remove contaminants associated with cigarette smoke.

Tobacco smoke is made up of gaseous pollutants and particulate matter. For example, cigarette smoke can include particles ranging between 4 to 0.01 microns. The first filter 106 can be configured to capture particulate matter including particular matter associated with the tobacco smoke. For example, a "true" HEPA filter can be configured to capture 99.97% of particles 0.3 microns in diameter and can be more efficient at capturing particles of a larger and smaller size. However, other less efficient filters, such as an HVAC filter can be used and the example of a "true" HEPA filter is provided for the purposes of illustration only.

The second filter 108 can include activated carbon. The activated carbon portion can adsorb volatile chemicals on a molecular basis associated with smoke or any other source. It can convert gaseous pollutants, such as volatile organic compounds found in smoke, to a solid form. It can also remove smaller size particles from the air, such as those not removed by the first filter 106. In one embodiment, the first filter 106 can be a HEPA filter of about ¾ inches wide and the second filter 108 can be an activated charcoal filter about ¼ inches wide. In one embodiment, the first filter 106 and the second filter 108 can be provided as a single unit. In another embodiment, the first filter 106 and the second filter 108 can be provided as separate filters which are individually replaceable.

The positioning of the filters 106 and 108 on the interior of the cabinet 1008 adjacent to the exterior side 1008c and the positioning of the game controller 1160 and the power supply 1146 is provided for the purposes of illustration only and is not meant to be limiting. For example, a portion of the plenum 102 can be provided between filter 106 and the side 1008c of the cabinet. As another example, the positions of the game controller 1160 and the power supply 1146 can be shifted within the plenum 102, such as closer to side 1008b.

Further, the positioning of the components 1160 and 1146 within the plenum 102 can be different. For instance, the order of components 1160 and 1146 can be reversed, such that component 1146 is in the position of component 1160 and component 1160 is in the position of component 1146. In another embodiment, the plenum 102 can be shaped to allow the components 1160 and 1146 to be vertically stacked beneath each other at the same location within the plenum 102 (the plenum can be made wider in the vertical direction to accommodate the components). In yet another embodiment, the components 1160 and 1146 can be horizontally stacked within the plenum 102, at the same position, one above the other. For example, component 1160 can be mounted to the back wall 1084 and then component 1146 can be mounted above it. Then, air can flow simultaneously over and between the two components stacked in this manner.

The game controller 1160 can include one or more substantially flat circuit boards with components mounted to each board, such as a CPU (see 1102 in FIG. 3) and a graphics processing unit (GPU) (see graphics card slot 1114 in FIG. 3). The CPU and GPU typically generate the most heat on the game controller. In one embodiment, a first side of circuit board, associated with the game controller 1160, can be mounted close to a first side of the plenum, such that the air flow is minimal between the first side of the circuit board and the first side of the plenum. The CPU and/or GPU can be mounted on a second side of the circuit board opposite the first side. A gap can be provided between the second side of the circuit board and a second side of the plenum. Air flowing through this gap can cool the CPU and GPU.

In yet another embodiment, as described above, the interior wall 1084 can form one side of the plenum 1002. In this example, a first side of circuit board forming the controller 1160 can be mounted close to an interior wall 1084 of the cabinet 1008, such that the air flow is minimal between the first side of the circuit board and the first side of the interior wall 1084. A heat sink, such as a metal heat sink, can be disposed between the first side of the circuit board and the interior wall 1084 of the cabinet. At this location, the interior wall 1084 can be formed from a heat conductive material such as sheet metal. Thus, heat deposited in the heat sink can flow into and through the interior wall 1084. The heat passing through the interior wall can be radiated out of the cabinet from an exterior surface on the back side 1008e of the cabinet.

In this embodiment, the CPU and/or GPU on controller 1160 can be mounted on a second side of the circuit board opposite the first side. A gap can be provided between the second side of the circuit board and a second side of the plenum 102. Air flowing through this gap can also cool the CPU and GPU. Thus, in this embodiment, cooling can be performed by heat being conducted away from a hot surface in the interior of the cabinet to a cool surface on the exterior of the cabinet where it is radiated outwards and cooling can be performed by heat being conducted away by air flow over the hot components being driven through the plenum 102.

In yet another embodiment, the first side of the circuit board of controller 1160 can be mounted with a first gap between the first side of the plenum and the first side of the circuit board. Further, a second side of the circuit board of controller 1160 can be mounted with a second gap between the second side of the plenum (opposite the first side of the plenum) and a second side of the circuit board. For example, the circuit board can be mounted to posts which extend from the first side of the plenum such that the circuit board is in a center of the air flow channel provided by the plenum.

In this configuration, air can flow through both the first gap and the second gap simultaneously providing cooling on both the first and second sides of the circuit board. In this example, the CPU can be mounted on the first side of the circuit board and the GPU can be mounted on a second side of the circuit board or vice versa. Alternatively, the CPU and the GPU can be both mounted on one of the first side or second side of the circuit board.

As shown in FIG. 5C, first vents, such as 116, can be located in the side 1008c of the gaming machine cabinet adjacent to one side of plenum 102. Air from outside the gaming machine cabinet 1008 can enter into the gaming machine via vents 116 and into interior of the plenum 102. Second vents, such as 120, can be located on a top 1008d of the gaming machine cabinet 1008. Air can exit from the plenum 102 and to the exterior of the gaming machine cabinet 1008 via vents 120. As described above, other vent locations are possible and this example is provided for the purposes of illustration only.

As shown in FIG. 5B, at least one fan 110 can be disposed within the plenum 102. The fan 110 can drive air through the plenum 102. In particular, the fan 110 can rotate in a direction that pulls air in through vent 116 and out through vent 120. In one embodiment, the fan 110 can be disposed near the top 1008*d* of the game cabinet 1008. In other embodiments, the fan can be located at other locations within the plenum, such disposed between the filter 106 and the vent 116. In yet other embodiments, multiple fans can be used. For example, a first fan can be located near vent 116 and a second fan can be located near vent 120.

In particular embodiment, fan 110 can be a single speed fan. In other embodiments, fan 110 can be a multispeed fan. In one embodiment, based upon a temperature of the air within the plenum 102, a determination can be made as to whether to turn fan 110 on or off. Further, when the fan is a multispeed fan, a determination can be made to set fan 110 at a particular speed. It may be desirable to turn the fan 110 off or set the fan 110 to as low a speed as possible to minimize fan noise and/or conserve power.

To determine the temperature of the air within the plenum 102, sensors can be placed at various locations. For instance, temperature sensor 112*a* can be disposed just downstream of the power supply 1146 and temperature sensors 112*b* can be disposed in the vertical portion of the plenum 112*b*. In another example, a temperature sensor (not shown) can be located on the game controller 1160. The temperature sensor can be used to monitor a temperature of the CPU and/or GPU. Further, a temperature sensor (not shown) can be associated with the power supply 1146. The locations and number of temperature sensors is provided for the purposes of illustration only and is not meant to be limiting.

In one embodiment, the air filtration and cooling system 100 can include a controller (not shown) configured to receive temperature data from one or more sensors. Based upon the temperature data, the controller can be configured to determine to turn the fan 110 on or off and/or set a speed of the fan 110. The controller can include logic device for processing the temperature sensor data and sending commands to the fan 110. The controller can also be configured to monitor whether the fan is working and possibly include a communication interface which allows a remote device to be contacted in the event of a system malfunction, such as too high a temperature within the plenum 102 or the fan 110 not operating properly.

In one embodiment, second sensors, such as 114 and 118 can be provided. The second sensors can be configured to measure one or more quantities which are characteristic of the air quality. Sensor 114 is located in vent 114 prior to the air entering filters 106 and 108. Thus, it can be used to measure a quantity that characterizes the air outside the cabinet 1008. Sensor 118 can be used to measure a quantity that characterizes air after it has passed through the filters 106 and 108. In particular embodiments, the air filtering and cooling system can include only one or both sensors 114 and 118.

Based upon information received from one or both of sensors 114 and 118, a logic device, such the logic device on a controller (not shown) associated with the air filtration and cooling system 100, can be configured to determine whether one or both filters 106 and 108 need to be replaced. For example, the sensor 114 can measure a quality of the air, such as a density of the smoke in the air entering the cabinet. Whereas sensor 118 can measure a quality of the air, such as density of the smoke in the air, after it has passed through the filters 106 and 108.

In FIG. 5B, based upon how much smoke has entered the filters, as measure by sensor 114, a determination can be made as to whether one or both filters, 106 and 108, need to be replaced. Similarly, based upon, the quality of the air after it has passed through the filters 106 and 108, a determination can be made as to whether one or both filters need to be replaced. In yet another example, based upon a difference in the quality of air as measured by sensors 114 and 118, a determination can be made as to whether one or both filters need to be replaced.

When the controller associated with the air filtration and cooling system 100 determines a filter needs to be replaced, a maintenance request can be generated. For example, the controller can be configured to communicate with an outside device. In another example, the controller can be coupled to the candle (see 1005 in FIG. 1). When maintenance is needed, the controller can be configured to send a command to cause the candle to light up.

In another embodiment, the controller can be built into the game controller 1160. Thus, the game controller 1160 can be configured to control whether the fan is turned on or not and at what speed it is run based upon the sensor data. Further, the game controller 1160 can be configured to determine whether one or both filters need to be replaced. When one or both filters need to be replaced, the game controller 1160 can be configured to generate a maintenance request which is sent to a remote device. In response, a maintenance technician can be sent to the gaming machine. In general, control of fan, monitoring of the sensors and determining whether a maintenance request is needed can be performed solely by a controller associated with the air filtration and cooling system, solely by the game controller 1160 or the functions can be distributed between the controller associated with the air filtration and cooling system and the game controller 1160.

In FIG. 5B, in one embodiment, the power supply 1146 can be directly coupled to the game controller 1160 via connection 127 within the plenum. In another embodiment, the power supply can be coupled to the backplane 104. Then, the game controller 1160 can receive power from the backplane 104 via connection 126. Various devices, such as the game controller 1160 and I/O devices can be coupled to the backplane and receive power via the backplane 104.

To allow the power to be sent to the backplane 104, one or more wires 128 can exit the power supply 1146, pass through a wall of the plenum 102 and reach the backplane 104. Where the wires 128 exit the plenum, a gasket 122 can surround the wires 128. The gasket 122 can prevent air from entering or exiting the plenum via the hole made for the wires 128. As described above, the power supply 1146 can convert an AC voltage in to a DC voltage out. Thus, the one or more wires 128 can carry a DC voltage to the backplane 104.

In FIG. 5B, the game controller 1160 can be configured to communicate with a plurality of devices coupled to the backplane 104. For example, the game controller 1160 can communicate with and send video data to a plurality of displays, can communicate with and send audio data to speakers, can communicate with and send commands to bill validators and printers and can receive input data from buttons and touchscreens. To allow the communications, wires 126 can exit the plenum 102 via an aperture. The gasket 124 can surround the wires and fit into the aperture to prevent from entering or exiting the plenum via the aperture. Further, the gasket can prevent tampering with the game controller 1160 via the aperture.

Figure 6A:
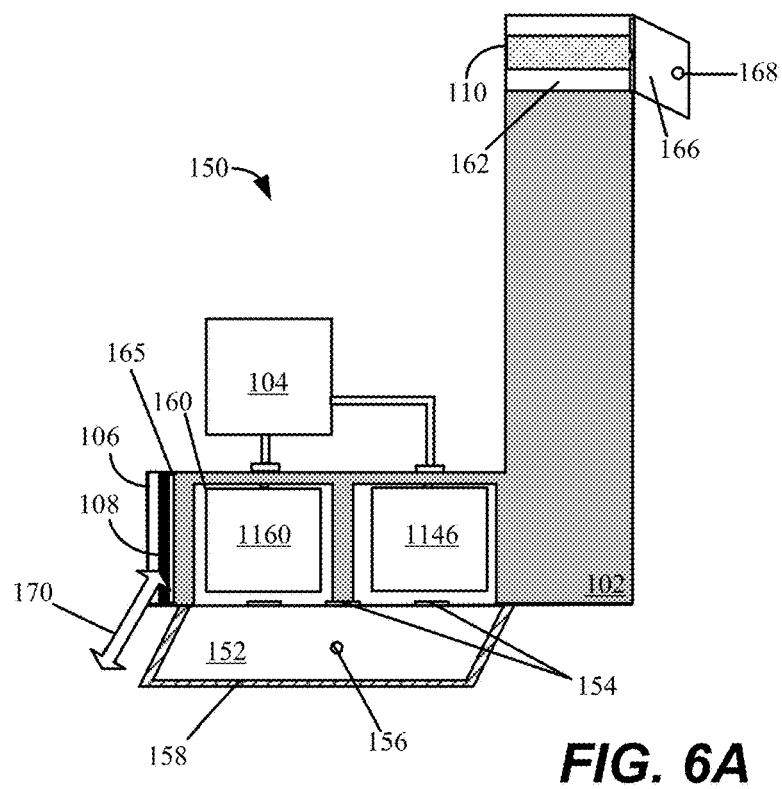
FIGS. 6A and 6B illustrate two embodiments of a cabinet air filtration system in accordance with embodiments of the present invention.
Figure 6B:
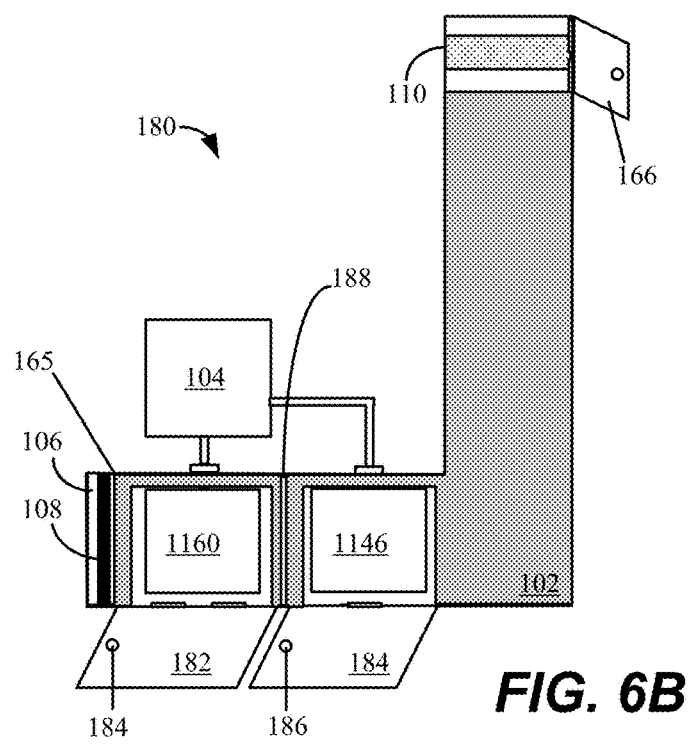

Next, with respect to FIGS. 6A and 6B, two embodiments, 150 and 180, of a cabinet air filtration and cooling system are described. In FIG. 6A, the plenum 102 of the air and filtration and cooling system 150 includes two doors 152 and 168. Door 152 is coupled to the plenum via hinges such as 154. The door 152 allows access to an interior 160 of the plenum 102 surrounding the game controller 1160.

The door 152 can include a sealing mechanism 158, such as a rubber gasket 158. The sealing mechanism 158 can prevent air from the interior of the cabinet from entering the plenum 102. The door 152 can include a locking mechanism 156. In one embodiment, a sensor can be coupled to the locking mechanism 156 and the game controller 1160. When the game controller 1160 detects the lock is actuated and/or the door 152 has been opened, the game controller 1160 can be configured to enter a tilt mode.

The door 166 can open to allow access to a second interior portion 162 of the plenum 102. The fan 110 can be located in the second interior portion. When the door 166 is open, the fan 110 can be removed and serviced. In one embodiment, the fan 110 can be included in a cartridge assembly that can easily be pulled out or slid into place.

A latch 166 can be used to secure the door 166. The latch 166 may or may not include a sensor which detects when the latch has been actuated and the door 166 has been opened. A sealing mechanism (not shown) can also be provided around door 166 to prevent air from entering the plenum from the interior of the cabinet. In another embodiment, rather than a door 166, a removable cover can be provided.

In FIG. 6A, in one embodiment, the plenum 102 can be divided into two compartments. For example, a wall 165 can be located adjacent to filter 108. The wall 165 can include apertures and possibly mesh which allows air into the portion of the plenum 102 including the game controller 1160.

The apertures in wall 165 can be sized to allow air to flow through the filters 106 and 108 and into an interior 160 of the plenum 102. Further, the apertures can be sized, such as made smaller, to prevent tampering, i.e., sticking something through an aperture to access the game controller 1160. A mesh over the apertures, such as a steel mesh, can be utilized for this purpose, i.e., to prevent tampering.

The filters 106 and 108 can be placed in the first compartment of the plenum 102. As described above, the plenum 102 can be divided into two compartments via wall 165. The first compartment is located to the left of wall 165 and the second compartment is located to the right of wall 165.

Guides can be provided which allow the filters to be slid into place or pulled out as shown by arrow 170. If needed, a cover (not shown) can be provided, which is placed over the filters 106 and 108. The cover can be removed to remove and install the filters. The cover can generate a seal which prevents air from entering or exiting the plenum 102 at the location where the filters 106 and 108 are installed.

In another embodiment, the wall 165 can be removed so that only a single compartment is formed in the plenum 102. To install the filters 106 and 108, the door 152 can be opened. Then, the filters can be slid through the opening associated with door 152 and pushed to the left within the plenum 102. The opening around the game controller 1160 can be enlarged to allow the filters to be inserted in this manner. Then, to remove the filters, the door 152 can be opened, the filters 106 and 108 can be pulled to the right and then removed through the opening associated with door 152.

An advantage of providing a compartment for the filters separate from the compartment including the game controller 1160 is that the filters can be replaced without unlocking and opening door 152. When the game controller 1160 is accessible, i.e., door 152 is opened, generally a higher level of security is required. For example, the presence of a technician and security guards. With the filters in a separate compartment from the game controller 1160, maintenance can be performed on the filters without the addition extra security personnel.

In FIG. 6B, in another embodiment, the plenum 102 is further compartmentalized. In particular, a first wall 165 in plenum 102 is located to filter 108 and a second wall 188 is disposed within the plenum 102 between the game controller 1160 and the power supply 1146. Thus, the plenum 102 is divided into three compartments.

In particular, a first compartment is the portion of the plenum 102 to the left of the wall 165. The first compartment includes the filters, 106 and 108. The second compartment is the portion of the plenum 102 between wall 165 and wall 188. It includes game controller 1160. The third compartment is the portion of the plenum 102 after wall 188. The third compartment includes the power supply 1146 and the fan 110.

The second wall 188 can include apertures (not shown) which allow air to flow from the second compartment including the game controller 1160 to the third compartment including the power supply 1146. The apertures can be configured to prevent tampering with the game controller 1160. For example, a plurality of small apertures can be used. Further, the apertures can be covered in a mesh that prevents access to the game controller via the apertures.

The second compartment in the plenum 102, including the game controller 1160, can be accessed via door 182. The door 182 can include a locking mechanism 184. The locking mechanism 184 can be monitored via one or more security sensors which are coupled to the game controller 1160. In addition, other security sensors, such as a light sensor, can be placed within the second compartment. These security sensors can be coupled to the game controller 1160. In response to detecting access to the second compartment, via information received from the sensors, the game controller 1160 can be configured to enter into a tilt mode where game play is disabled on the gaming machine. Further, the game controller 1160 can be configured to store the event as critical data to a power-hit tolerant memory.

The third compartment of the plenum 102, which includes the power supply 1146, is accessed via door 184, which also includes a latch 186. The latch 186 may optionally include a locking mechanism. In alternate embodiment, a cover can be placed over the opening to the third compartment.

In one embodiment, electrical components, such as power supply 1146, which don't control play of the wager-based game can be placed in the third compartment. Via door 184, the electrical components in the third compartment can be accessed for maintenance while door 182 remains locked. When door 182 is locked, the game controller 1160 is not accessible. Hence, the electrical components in the third compartment can be serviced with a lower level of security, such as fewer personnel, as compared to the game controller 1160.

Next, additional details of the gaming machine are described. In particular, gaming software executed by the game controller 1160 used to control the play of the wager-based game on the gaming machine are described. FIG. 7 illustrates a block diagram of examples of gaming software 1130 that can be executed by a Gaming Machine Controller (GMC) 1160 in FIG. 3. The game software 1202 can be configured to control the play of the game. The play of the game includes determining a game outcome and award associated with the game outcome using the RNG software 1210.

The award can be presented as a number of different presentation components where a portion of the award is associated with each presentation component. These presentation components can be referred to as game features. For example, for a video slot game, game features can involve generating a graphical representation of symbols moving and lining up along a combination of different lines. Portion of the award can be associated with different lines. In another example, the game features can involve free spins. In yet another example, the game feature can involve generating a graphical representation of symbol and then actuating a mechanical device, such as wheel to indicate an award portion.

In a further example, a game feature can involve a bonus game where a portion of an award for a game is presented in a separate bonus game. The bonus game can involve inputting choices, such as a selection of a symbol. Similar to the primary game, the bonus game can include bonus game features where bonus game award is graphically presented in a number of different portions. A primary game can include game features which trigger different bonus games with different bonus game features.

As described above, game features and bonus game features can be stored to a power hit tolerant memory (PHTM). The PHTM software 1204 can be configured to manage the transfer of crucial data to and from the PHTM. Further, as described above, the PHTM software 1204 can be configured to verify the integrity of the data stored in PHTM.

In particular embodiments, the game 1202 has no knowledge of PHTM. Thus, the utilization of the PHTM can be totally abstracted from the game 1202 and contained in a shared object that is loaded at runtime. This shared object will also determine if the PHTM is available and how much memory space is available. If there is no PHTM, or it doesn't contain enough memory, the shared object can be configured to automatically use a disk file instead. This function may allow the game to be run in a windows environment and still have the ability to recover from a power hit.

One purpose of the PHTM 1204 is proper recovery from a power hit. In order to facilitate proper power hit recovery, numerous transition points can be built into the game 1202 where crucial data is stored to PHTM at each transition. The transitions can be implemented as states, which can be referred to as game states or game state machines. The states themselves can also be stored in PHTM so that on startup, after validating that the PHTM is not corrupt, the game 1202 can then check the current state that is stored. That state will then determine where the game will restart. The idea is that whenever a state transition occurs and is saved, the data needed to recover to that state has also been stored in PHTM.

Different approaches can be used in deciding when to save data to PHTM. In one embodiment, a thread runs in the background that constantly checks the data in memory against a copy of what's in PHTM as well as a force write flag. If the force write flag has been set or if it sees that the crucial data has changed, PHTM software 1204 writes it to the physical PHTM, updating the copy as well.

In another embodiment, the PHTM software 1204 can be configured to write all data directly to PHTM as it occurs. At certain times the PHTM software 1204 can be configured queue writes rather than committing them in order to make it an "all or nothing" write. This feature can be normally done for something that is going to cause a state change, a cash-out, etc. This feature can allow all the meters or crucial data associated with the game to be written at once, keeping the window of opportunity for corruption to the smallest amount of time possible.

In particular embodiments, multiple state machines can be used that are based on the overall game state machine. For example, separate "sub-state machines" can be used for critical functions that use external I/O devices, such as bill acceptors and printers. If the game 1202 restarts in a state that requires more granularity and has a different state machine such as a cash out or a ticket inserted state, it can switch to that sub-state machine to complete the actions and then return to the overall game state machine.

In particular embodiments, the sub-state machine concept can be used for areas of the game that are outside of the main game flow such as bonus games. For example, if the game is in a bonus game with bonus game feature including a free spin bonus round and the power cycles before all of the free spins have finished, the game will recover to the spin that was being executed when the power cycled and will continue from there. If the game is in a bonus game during a bonus game feature including a pick bonus, the game 1202 can recover to the point where the power cycle occurred. In particular, the picks that have already been made can be displayed and then the bonus game can continue from that point including receiving additional picks. Further, the game 1202 may be configured using the crucial data stored in the PHTM to regenerate on the display all or a portion of the game states prior to the power hit, such as the initial state of the game and game states that occurred prior to the bonus game.

The game playback 1206 can be used to display information associated with one or more game states of a wager-based game previously played on a gaming machine. As an example, a particular wager-based game can be initiated and played on the gaming machine. During game play of the particular game, crucial data associated with game states that occur can be stored to the PHTM. Subsequently, one or more additional games can be played on the gaming machine. Then, using crucial data recalled from the PHTM, game information associated with the particular game can be redisplayed on the gaming machine. The game information can include but is not limited to a) text information, b) screen shots that were generated during game play and c) a regeneration of all or a portion of a graphical game presentation associated with the particular game.

Typically, to access the gameplay back feature, the gaming machine has to be placed in a tilt mode where an operator menu is available. From the operator menu, using game playback software 1206, an operator can select a particular game for playback from among a plurality of games previously played on the gaming machine. To resume normal game play, the tilt mode can be cleared and the gaming machine can revert to a normal operating state. More details of game play back are described with respect to FIG. 11.

The security software 1208 can be configured to respond to information received from various security sensors disposed on the gaming machine and from the power-off security device (e.g., see 1138 in FIG. 3). For example, the security software 1208 can be configured to detect that a locking mechanism has been actuated on the gaming machine and then cause the gaming machine to enter a tilt mode. As another example, the security software 1208 can be configured to receive information from the power-off security device that the gaming machine door was opened while the gaming machine was being shipped. In response, the security software 1208 can cause the gaming machine to enter a tilt state. In yet another embodiment, the security software 1208 may not be able to detect a sensor, such as a sensor (e.g., see sensors 1140 in FIG. 3) which monitors a state of a door and in response enter a tilt state.

The RNG software 1210 can be configured to generate random numbers used to determine the outcome to a wager-based game. In one embodiment, a Mersenne twister random number generator (RNG) algorithm, which generates integers in the range $[0, 2^k-1]$ for k-bit word length with a period of $(2^{19937})-1$ can be used. It has a longer period and a higher order of equi-distribution than other pseudo-random number generators. The Mersenne Twister is also very fast computationally as it uses no division or multiplication operations in its generation process. It can work well with cache memory and pipeline processing.

In particular embodiments, the RNG cycles at seventy RNG cycles/second or above, such as equal to or above one hundred RNG cycles/second. This speed has been determined by engineers at the Nevada Gaming Control Board to be fast enough that it cannot be timed by the player. The tests showed that above seventy RNG cycles/second successfully hitting a specific outcome became sporadic, and the results were completely unpredictable at one hundred RNG cycles/second. An evaluation showed the variance in the contact mechanism of mechanical switches and the inherent variance in the "button press" detection circuitry, combined with the inability of a person to repeat a movement, provided enough ambiguity in the final registration of the button press to eliminate a player's ability to affect the payback characteristics of the game.

The RNG can be seeded using a plurality of variables. In particular embodiments, the RNG can be seeded by four variables that eliminate the same seed sequence from being used in more than one device, such as two gaming machines using the same RNG seed. The variables can be 1) absolute time, 2) time since the machine powered up, 3) machine number and 4) a random number from the kernel base RNG "/dev/urandom." The random number from the kernel can be associated with the Linux Kernel. This RNG "/dev/urandom" can be based on random occurrences, such as times between keystrokes, mouse movements, timing between interrupts, and hardware occurrences. These occurrences can be used to build and maintain an entropy pool.

The system protects against the same sequence in several ways. First, even if two games are powered on at exactly the same time, there is enough variability in the exact time that the time since power up should prevent any two games from having the same number returned from this function. Also, the "urandom" RNG is entropy based, and is self-seeded from environmental noise contained in the kernel, which makes it unlikely that two machines would ever have the same seed. Finally, the machine number (EPS number) is used as part of the seed. Because this number is used to uniquely identify the gaming machine on the floor, it should always be different from any other machine.

The communications software 1212 can be used to provide communications via the various communication interfaces and using various communication protocols. For example, the communications software 1212 can support the SAS protocol over wired or wireless communication interfaces. In another example, the communication software may allow the gaming machine to communicate with a mobile device via a wireless communication interface using a Bluetooth™ protocol.

The player tracking software 1214 may allow the GMC to communicate with a player tracking device installed on the gaming machine and/or directly with a remote server which provides player tracking services. For example, a player tracking device can be configured to communicate a GMC to transfer credits to and from the gaming machine. In another embodiment, the GMC can be configured to receive player tracking information from a card inserted in a card reader (e.g., see 1028 in FIG. 1) or via wireless communications with a player's mobile device. Then, GMC can communicate with a remote server to receive information associated with a player and send information associated with the player's game play on the gaming machine.

The devices software 1216 may be used to allow the GMC to communicate with various devices coupled to the gaming machine, such as I/O devices coupled to gaming machine. For example, the devices software may allow the GMC to communicate with a bill acceptor (e.g., see bill acceptor 1024 in FIG. 1) and in response add credits to the gaming machine. In another example, devices software may allow the GMC to communicate with a printer (e.g., see printer 1022 in FIG. 1) and in response cash out credits from the gaming machine in the form of printed ticket.

The power hit software 1218 can allow GMC to respond to power hits. For example, the power hit software can monitor the power supply and in response to a detection of power fluctuations update the PHTM with crucial data. In another example, when the gaming machine is power-up from a power hit, the power hit software 1218 can determine the power hit occurred during game play and initiate a restoration of the gaming machine to its state when the power hit occurred.

The tilt software 1220 can be configured to monitor sensors and gaming devices for tilt conditions. In response to the detection of a tilt condition, the tilt software 1220 can cause the gaming machine to enter a tilt state. Further, the tilt software 1220 can record tilt information to the PHTM.

For example, when a machine door open is detected, the game can tilt with a hard tilt that prevents play and disables the game. If the gaming machine includes a tower light, the tower light can flash to indicate that a door is open. Further, a "DOOR OPEN" indication can be displayed on the main display screen. Upon a detection of the door closing, the tower light can stop flashing and the "DOOR OPEN TILT" can be replaced with a "DOOR CLOSED SOFT TILT."

The door open tilt condition can be the behavior for all the machine doors, such as door 1014 in FIG. 1 or a CPU enclosure door (not shown). Additionally, the behavior may not change for multiple doors that are open. Thus, the "DOOR OPEN" indication can remain on, and the machine will be disabled until all the doors are closed. After the final door is closed, the tower light can go off, the game can become playable and the "DOOR OPEN" indication can be written over by a "DOOR CLOSED" indication which will remain until the end of the next game cycle.

A number of tilts can be generated that must be cleared by an attendant. These tilts may include clearing the condition with a key switch or, for tilts such as "PAPER OUT," the tilt may clear automatically after the attendant has remedied the malfunction. A low battery for a PHTM (e.g., see NVRAM 1122 in FIG. 3 or 1204 in FIG. 7) can be indicated by a "RAM BATTERY" tilt.

A "PRINT FAILURE" tilt can occur when there is a failure to print a ticket. In response, a printer hard tilt error can be issued and the description will indicate that the printer is offline. The tilt can be cleared when the printer is brought back online.

A "PRINT MECHANISM/PAPER JAM" tilt can occur for a paper jam. The game can indicate the paper jam has occurred and the printer is off-line (e.g., see printer 1022 in FIG. 1). This tilt can be cleared by clearing the jam and reinserting the paper into the printer.

A "PAPER OUT" tilt can occur when the printer runs out of tickets (e.g., see printer 1022 in FIG. 1). In response to detecting no remaining tickets, the game can display information indicating no paper is available and the game can be disabled. This tilt can be cleared when new printer stock is fed into the printer.

A defective storage media tilt can occur when an error is detected in a critical memory device, such as the memory storing the game software (e.g., see 1130 in FIG. 3), the memory storing the BIOS (e.g., see BIOS 1126 in FIG. 3) or the PHTM storing crucial data (e.g., see NVRAM 1122 in FIG. 3). A message indicating the validation error can be displayed. This tilt may require a "RAM CLEAR" to remedy the tilt condition. A "RAM CLEAR" can erase all meter, recall and other critical memory.

As described above, multiple copies of crucial data can be stored in the PHTM (e.g., see NVRAM 1122 in FIG. 3) and the GMC (e.g., see GMC 1160 in FIG. 3) can be configured to detect and correct copies of faulty data. When uncorrectable memory is detected in the PHTM or another device, it can result in a "CRITICAL MEMORY ERROR" tilt. Again, this tilt can require a "RAM CLEAR" to remedy the condition. Again, the "RAM CLEAR" can erase all meter, recall and other critical memory.

A "BILL JAM" can occur when the bill acceptor detects a bill jam (e.g., see bill acceptor 1024 in FIG. 1). The tilt condition can be displayed on the display, such as main display 1018 in FIG. 1. This is a hard tilt which disables the game until an operator clears the bill jam condition.

When a stacker is full, the game can displays a soft tilt error on the main screen. A "stacker full" may be displayed as a security measure. The stacker can be coupled to a bill acceptor and located in the main cabinet of a gaming machine (e.g., see bill acceptor 1024 in FIG. 1). The game can remain playable but will not accept any further currency or tickets. This tilt is automatically cleared once the stacker is emptied or replaced. When the stacker is removed, the game will be disabled and display a "STACKER OPEN" message. This tilt can be cleared when the stacker is reinserted.

The software validation software 1222 can be executed by the CPU to validate the various software components on the gaming machine. For example, hashes of memory blocks can be performed and compared to stored hash values. This software can differ from the validation logic which is executed separately by the BIOS to perform validation functions.

The metering software 1224 can be used to update the hard meters and generate and update the soft meters. The metering software 1224 can be configured to store metering information to the PHTM (e.g., see NVRAM 1122 in FIG. 3). Examples of the meters which can be maintained are described above with respect to meters 1144 in FIG. 3.

Figure 8:
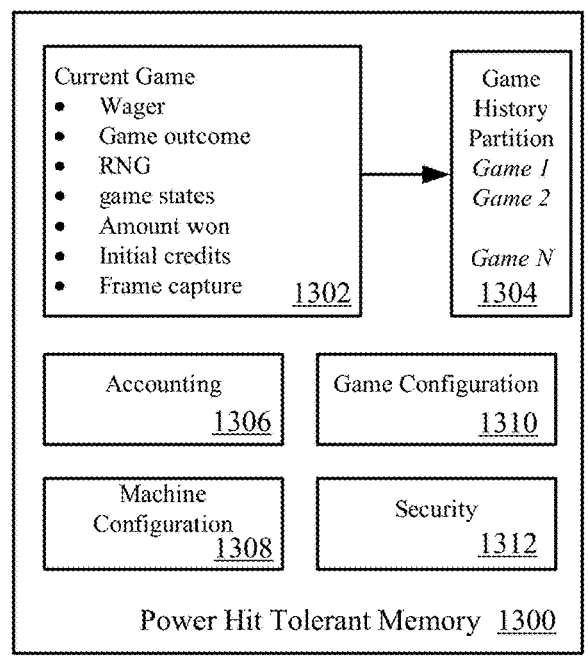
FIG. 8 illustrates a block diagram of power hit tolerant memory in accordance with embodiments of the present invention.

FIG. 8 illustrates a block diagram of one embodiment of a power hit tolerant memory (PHTM) (Additional details of PHTMs are described with respect to NVRAM 1122 in FIG. 3 and PHTM 1204 in FIG. 7). Crucial information associated with the current game can be stored in 1302. Some examples of crucial information include but are not limited to a wager amount, a game outcome, one or more random numbers to determine the game outcome, information about game states and sub-states including the current game state, an amount won, initial credits and frame captures associated with one or more states. As described above, this information can be used to return the game to a current state after a power-hit. The one or more random numbers can be used to regenerate a particular game outcome associated with the random numbers and the wager amount.

After a game is completed, it can be moved to a game history partition 1304. The game history partition can store crucial data associated with a plurality of previously played games. For example, in one embodiment, the PHTM 1300 can be configured to store crucial data associated with the current game and nine past games. In another embodiment, the PHTM 1300 can store information associated with up to one hundred past games.

When the maximum number of games in the game history partition is reached, the software which manages the PHTM 1300 can be configured to delete the oldest game. This process can occur prior to starting the next game. For example, if a maximum of ten games are stored in the game history 1304, then prior to the play of the eleventh game, the oldest game can be cleared from the memory. In one embodiment, prior to the deletion of the crucial data associated with the oldest game, it can be copied to a secondary persistent memory.

In 1306, accounting information can be stored. The accounting information can include the metering information previously described above. In some embodiments, this information can be recalled in the event of a power failure.

In 1308, machine configuration information can be stored. Some example of machine configuration information can include but is not limited to Manufacturer ID, date of manufacturing, machine ID, operating system version, number of screens, cabinet type, hard disk capacity, PHTM capacity, number of PHTM banks, printer model information, touch screen model information, card reader model information, bill acceptor model information, display model information, jurisdiction information, casino name and other information, sales order #, manufacture information, logo's, etc. In one embodiment, the public key used in the code validation process can be stored here.

In game configuration 1310, game configuration information can be stored. The game configuration information can include paytable selection, game features selections, bonus selections, jackpot contribution setting, denominations, max number of paylines, number of game titles and game versions. A gaming machine can have many paytables with different holding percentages which can be selected by the casino. Similarly, selectable game features and bonus features can be provided.

In security 1312, security information can be stored. Security information can include information that lead to a tilt condition and the associated tilt condition. For example, if a door is opened, the security information can include when the door was opened, when game play was disabled, when the door was closed, when the tilt condition was cleared and when game play was subsequently enabled.

FIG. 9 illustrates a method 1400 for responding to a power interruption on a gaming machine. In 1402, the gaming machine can begin a power-up process 1425. The power-up process can begin when a power switch in the interior of the gaming machine is turned on or when power is restored after a power interruption. In response to detecting external power is available, a signal can be generated which initiates a software integrity check on in 1404.

In 1404, the software integrity on the gaming machine can be checked. In particular embodiments, a public key/private key method and a "ladder of trust" can be used to verify control programs executed by the game controller. The initial rung of the ladder of trust can be the BIOS EPROM (see 1126 in FIG. 3), which may be a conventional ROM device. This conventional ROM device can load and can verify the initial code which continues the "verify then load" ladder of trust until the entire operating system and the game is loaded. This process was described above in detail with respect to FIG. 3.

In 1406, the power-off security device (see 1138 in FIG. 3) can be checked. The power-off security can monitor all the doors in the EGM. For example, the doors can use optical emitter/sensor pairs, but some might also use Hall-effect sensors. The system can be a standalone device with a CPU, RAM, NVRAM, sensors I/O board, and battery. The battery can be configured to last at least 30 days. It can be configured to record all critical events, such as power brown out, power black-out, main door open, logic (CPU) door open, bill acceptor door open, printer door open, top box door open and player tracking door open. These critical events may have occurred while the GMC was shut down and hence not monitoring the gaming machine for critical events.

In 1408, the machine integrity can be checked. For example, the security sensors on the gaming machine can be checked to verify all the doors are closed. Further, gaming devices, such as the printer and the bill acceptor, can be checked to determine the devices are operating properly (e.g., see printer 1022 and bill acceptor 1024 in FIG. 1).

In 1410, critical memory on the gaming machine can be checked. For example, the PHTM can be checked to make sure the stored information matches associated hash values. As described, a hash value can be generated for crucial data stored in the PHTM. The hash values can be stored with the crucial data. When the PHTM integrity is checked, new hash values can be generated and compared to the stored hash values.

In 1412, the GMC can determine whether all the checks were successful. If one or more of the checks are not successful, in 1414, the gaming machine can enter a tilt state and game play on the gaming machine can be disabled. Information about the tilt state can be output to a display, such as the main display on which a gaming presentation for a wager-based game is output.

In 1416, when all the checks are successful, event information associated with the successful power-up process can be stored to the PHTM. For example, the time that the gaming machine was enabled for game play can be stored to the PHTM. In one embodiment, as described above, this information can be used to generate a seed for a random number generator used on the gaming machine.

In 1418, the gaming machine can enter game play mode. Thus, the gaming machine is enabled to accept bills and tickets that are redeemed for credits on the gaming machine. After credits are deposited, the gaming machine can be used to make wagers on the game(s) available for play on the gaming machine. In 1420, the GMC can generate wager-based game play on the gaming machine and store crucial game play data to the PHTM.

Figure 10:
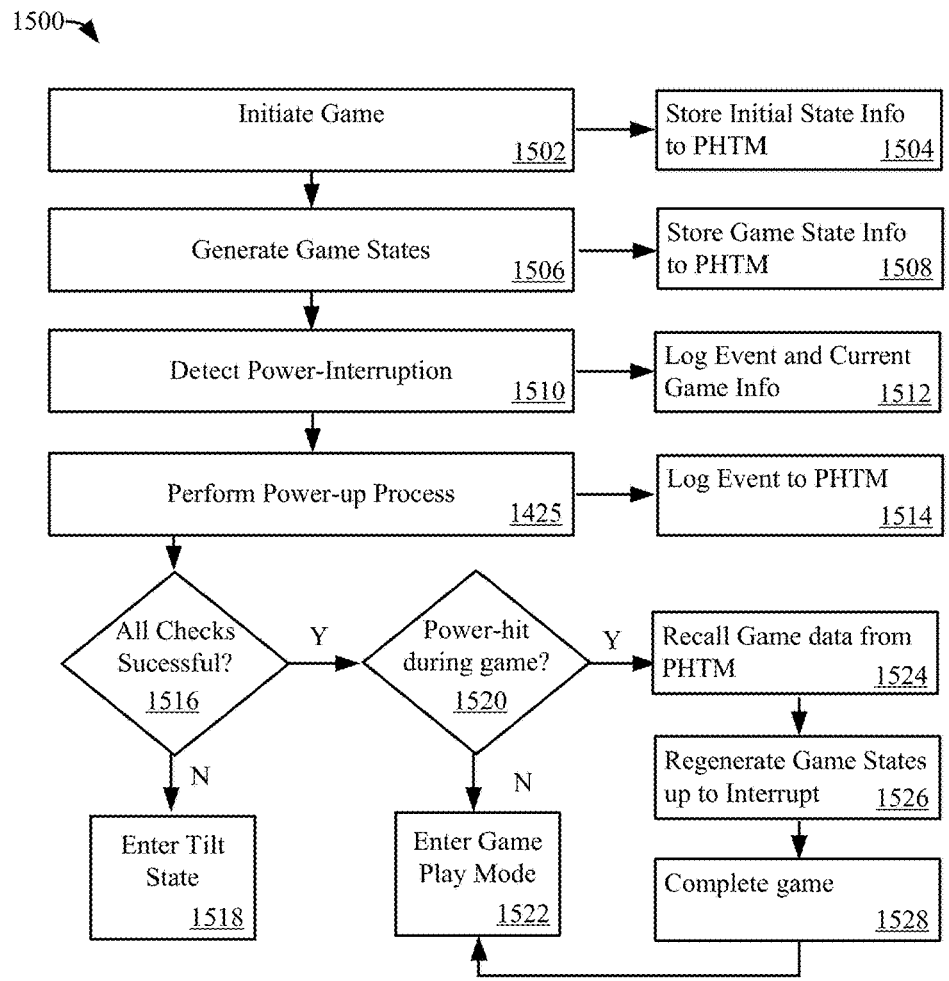
FIG. 10 illustrates a method powering up a gaming machine in accordance with embodiments of the present invention.

FIG. 10 illustrates a method 1500 powering up a gaming machine. In 1502, a wager can be placed and a game can be initiated. In 1504, initial state information associated with the game can be stored to the PHTM. In 1506, game states associated with the game can be generated. In 1508, crucial data associated with the game states can be stored to the PHTM.

In 1510, a power-interruption can be detected. For example, the GMC can receive a signal from the power supply which indicates a power spike associated with a power shutdown has occurred. In 1512, the event can be logged to the PHTM. In addition, current game state information can be logged to the PHTM prior to the power failure. After power is lost, the GMC may no longer operate unless an uninterruptable power supply is available.

In 1425, the power-up process in FIG. 9 can be performed. In 1514, this event can be logged to the PHTM. In 1516, whether the power-up process is successful can be checked. In 1518, if the check is not successful, the gaming machine can be placed in a tilt state and information about the tilt state can be output.

In 1520, a check can be performed to determine whether the power-hit occurred during the play of a game and prior to completion of the game. This information can be stored in the PHTM. In 1524, when the power-hit occurred during the play of a game, data associated with the game including the current game state can be retrieved from the PHTM. In 1526, the game can be regenerated up to the current game state just prior to the power hit. In some embodiments, the gaming machine can be configured in the current game state without showing any information leading up to the current game state. In other embodiments, one or more game states prior to the current game state can be regenerated and output to the display.

In 1528, the current game can be completed. In 1522, the game can be enabled for game play. In 1520, when the power-hit didn't occur during play of a game, the gaming machine can be powered-up and enabled for game play in 1522.

Figure 11:
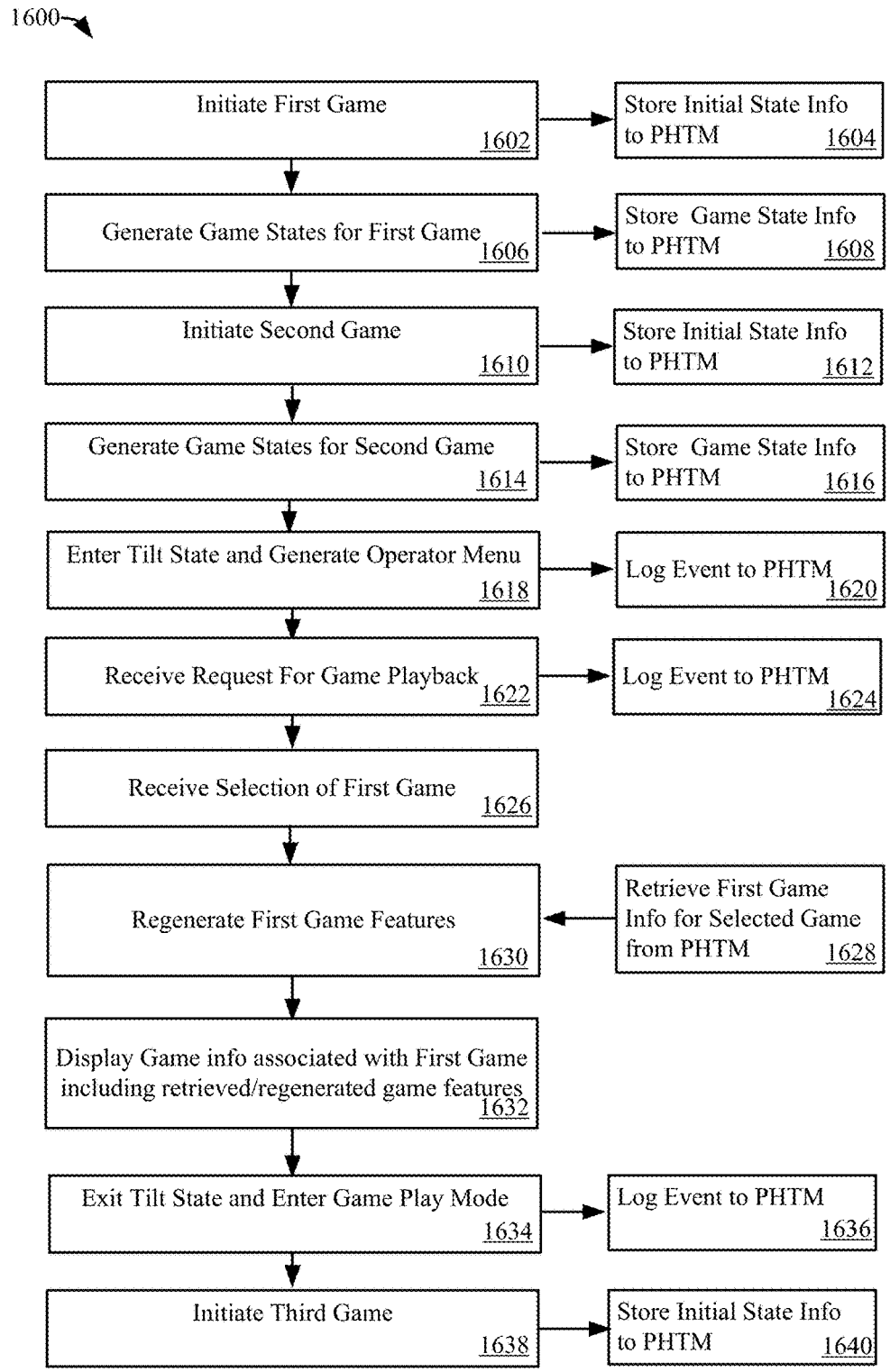
FIG. 11 illustrates a method playing back a game previously played on a gaming machine in accordance with embodiments of the present invention.

FIG. 11 illustrates a method 1600 playing back a game previously played on a gaming machine. In 1602, a first game can be initiated on the gaming machine. In 1604, initial state information about the first game can be stored to the PHTM. In 1606, game states for the first game can be generated. In 1608, the game states can be stored to the PHTM. As described, in the event of a power-hit during play of the first game, the GMC (e.g., see GMC 1160 in FIG. 3) can be configured to restore the game and the gaming machine to a game state just prior to the power hit using information retrieved from the PHTM (e.g., see NVRAM 1122 in FIG. 3).

After the completion of the first game, in 1610, a second game can be initiated. The initial state information for the second game can be stored to the PHTM (e.g., see NVRAM 1122 in FIG. 3). In 1614, the game states for the second game can be generated and the second can be brought to completion. In 1616, the game state information for the second game can be stored to the PHTM.

In 1618, the gaming machine can enter a tilt state. In one embodiment, the tilt state can be initiated in response to the operator inserting and turning a key in a locking mechanism on the outside of the gaming machine cabinet. Then, an operator menu can be generated and output to a display on the gaming machine. In 1620, the tilt state event can be logged in the PHTM.

In the 1622, the gaming machine using an input device, such as a touch screen, can receive a request for a game playback. The game playback can involve displaying information about a game previously played on the gaming machine. In 1624, this event can be logged to the PHTM. In 1626, a particular previously played game can be selected from among a plurality of games with game information stored in the PHTM. In this example, the first game played is selected.

In 1628, game information associated with the first game is retrieved from the PHTM. Some examples of game information which can be retrieved includes but are not limited one or more of random numbers used to generate the first game, screen shots, award information, bet information, credit information and screen shots from one or more game states.

In 1630, first game features can be regenerated. These game features can include animations of the play of the game, which represent one or more game states, or static images representing different game states. The animations of the play of the game can be regenerated using random numbers associated with the original play of the first game.

In 1632, game information associated with the first game, including the retrieved screen shots, regenerated static images and regenerated animations, can be output to a display on the gaming machine. In one embodiment, the display can be the display where the game presentation for the wager-based game is output (e.g., see display 1018 in FIG. 1). In 1634, the gaming machine can exit the tilt state and enter game play mode. For example, to initiate this process an operator can turn a key in the locking mechanism and remove it from the locking mechanism.

In 1636, initiation of game play can be logged as an event to the PHTM. In 1638, a third game on the gaming machine can be initiated. In 1640, the initial state information associated with the third game can be stored to the PHTM.

Because such information and program instructions may be employed to implement the systems/methods described herein, the present invention relates to tangible, machine readable media that include program instructions, state information, etc. for performing various operations described herein. Examples of machine-readable media include hard disks, floppy disks, magnetic tape, optical media such as CD-ROM disks and DVDs; magneto-optical media such as optical disks, and hardware devices that are specially configured to store and perform program instructions, such as read-only memory devices (ROM) and programmable read-only memory devices (PROMs). Examples of program instructions include both machine code, such as produced by a compiler, and files containing higher level code that may be executed by the computer using an interpreter.

Although many of the components and processes are described above in the singular for convenience, it will be appreciated by one of skill in the art that multiple components and repeated processes can also be used to practice the techniques of the present disclosure.

While the present disclosure has been particularly shown and described with reference to specific embodiments thereof, it will be understood by those skilled in the art that changes in the form and details of the disclosed embodiments may be made without departing from the spirit or scope of the invention. It is therefore intended that the invention be interpreted to include all variations and equivalents that fall within the true spirit and scope of the present invention.

What is claimed is:

1. A gaming machine comprising:
   a lockable cabinet including an entry that provides access to an interior of the cabinet, a locking mechanism coupled to the entry and including a lock that secures access to the interior of the cabinet, and a plurality of security sensors wherein at least one of the plurality of security sensors is used to detect an unlocked access to the interior of the cabinet;
   a power supply, disposed within the interior of the cabinet, coupled to receive power from an external power source;
   a power-off security device disposed within the interior of the cabinet coupled to one or more of the plurality security sensors and providing monitoring of access to the cabinet even when the power supply is unpowered by the external power source;
   a display, coupled to the cabinet, and displaying content associated with play of a wager-based game;
   a non-volatile memory, disposed within the interior of the cabinet and storing gaming software used to generate a wager-based game on the gaming machine;
   a power-hit tolerant memory, disposed within the interior of the cabinet and providing timely and nonvolatilely secure storage of crucial data associated with play of a plurality of instances of the wager-based game such that the instances may be retrieved even in the event of a power hit;
   a gaming machine controller, including a processor and a memory, disposed within the interior of the cabinet, coupled to the power supply, the power-off security device, the plurality of security sensors, the display, the non-volatile memory and the power-hit tolerant memory and programmed to 1) control play of a wager-based game being presented by way of the display; 2) validate the gaming software, 3) verify integrity of crucial data stored within the power-hit tolerant memory, 4) monitor the power-off security device and the plurality of security sensors to detect tilt conditions and 5) timely store the crucial data associated with the plurality of instances of the wager-based game to the power-hit tolerant memory such that the instances may be retrieved even in the event of a power hit; and
   an air filtration and cooling system including 1) a plenum disposed within the interior of the cabinet and providing containment of air, the contained air being only that flowing through the plenum, where an air admitting first end of the plenum is coupled to a first vent on an exterior of the cabinet and an air exhausting second end of the plenum is coupled to a second vent on the exterior of the cabinet such that air from outside the cabinet flows into the plenum through the first vent, and exits through the second vent, 2) a fan, disposed within the plenum, which drives the flow of air through the plenum and 3) a filter mechanism, disposed within the plenum so as to receive the air from the exterior of the cabinet and filter out at least airborne particulate matter produced from smoking of cigarettes, where in addition to being disposed within the interior of the cabinet, the gaming machine controller is disposed within the plenum and where the air passed through the filter mechanism is passed directly over a heat emanating part of the gaming machine controller so as to remove heat from the gaming machine controller;
   wherein the plenum includes a plenum-accessing door having a locking mechanism wherein the plenum-accessing door is unlocked and opened to access at least the gaming machine controller within the plenum.

2. The gaming machine of claim 1, wherein the power supply is disposed within the plenum and where the air passed through the filter mechanism is passed directly over a heat emanating part of the power supply so as to remove heat from the power supply.

3. The gaming machine of claim 1, wherein the gaming machine cabinet includes a top, a front, a back and two sides connecting with the front and the back so as to form the interior of the cabinet and wherein the first vent is located on a lower half of one of the two sides and wherein the second vent is located on the top.

4. The gaming machine of claim 1, wherein the gaming machine cabinet includes a top, a front, a back and two sides connecting with the front and the back so as to form the interior of the cabinet and wherein the first vent is located on a lower half of the back of the gaming machine cabinet and wherein the second vent is located on the top.

5. The gaming machine of claim 1, wherein the gaming machine cabinet includes a top, a front, a back and two sides connecting with the front and the back so as to form the interior of the cabinet and wherein at least one of the first vent and the second vent is located on the back of the gaming machine cabinet.

6. The gaming machine of claim 1, wherein the filter mechanism includes a first filter which filters out the airborne particulate matter and a second filter which filters out adherent gaseous components of the air flowing into the plenum, the adherent gaseous components being those that can solidify and adhere to surfaces inside the plenum.

7. The gaming machine of claim 6, wherein the first filter is designed to remove particulate matter as small as that sized in a range between 4 to 0.01 microns.

8. The gaming machine of claim 6, wherein the second filter includes activated carbon.

9. The gaming machine of claim 1, wherein the interior of the cabinet has a substantially rectangular prismatic shape with vertical sidewalls and the plenum includes a horizontally-extending portion and a vertical exhaust portion extending upwards from the horizontally-extending portion.

10. The gaming machine of claim 1, wherein the plenum is formed from sheet metal.

11. A gaming machine comprising:
a lockable cabinet including an entry that provides access to an interior of the cabinet, a locking mechanism coupled to the entry and including a lock that secures access to the interior of the cabinet, and a plurality of security sensors wherein at least one of the plurality of security sensors is used to detect an unlocked access to the interior of the cabinet;
a power supply, disposed within the interior of the cabinet, coupled to receive power from an external power source;
a power-off security device disposed within the interior of the cabinet coupled to one or more of the plurality security sensors and providing monitoring of access to the cabinet even when the power supply is unpowered by the external power source;
a display, coupled to the cabinet, and displaying content associated with play of a wager-based game;
a non-volatile memory, disposed within the interior of the cabinet and storing gaming software used to generate a wager-based game on the gaming machine;
a power-hit tolerant memory, disposed within the interior of the cabinet and providing timely and nonvolatilely secure storage of crucial data associated with play of a plurality of instances of the wager-based game such that the instances may be retrieved even in the event of a power hit;
a gaming machine controller, including a processor and a memory, disposed within the interior of the cabinet, coupled to the power supply, the power-off security device, the plurality of security sensors, the display, the non-volatile memory and the power-hit tolerant memory and programmed to 1) control play of a wager-based game being presented by way of the display; 2) validate the gaming software, 3) verify integrity of crucial data stored within the power-hit tolerant memory, 4) monitor the power-off security device and the plurality of security sensors to detect tilt conditions and 5) timely store the crucial data associated with the plurality of instances of the wager-based game to the power-hit tolerant memory such that the instances may be retrieved even in the event of a power hit; and
an air filtration and cooling system including 1) a plenum disposed within the interior of the cabinet and providing containment of air, the contained air being only that flowing through the plenum, where an air admitting first end of the plenum is coupled to a first vent on an exterior of the cabinet and an air exhausting second end of the plenum is coupled to a second vent on the exterior of the cabinet such that air from outside the cabinet flows into the plenum through the first vent, and exits through the second vent, 2) a fan, disposed within the plenum, which drives the flow of air through the plenum and 3) a filter mechanism, disposed within the plenum so as to receive the air from the exterior of the cabinet and filter out at least airborne particulate matter produced from smoking of cigarettes, where in addition to being disposed within the interior of the cabinet, the gaming machine controller is disposed within the plenum and where the air passed through the filter mechanism is passed directly over a heat emanating part of the gaming machine controller so as to remove heat from the gaming machine controller
wherein the plenum is mounted to a back interior wall of the cabinet.

12. The gaming machine of claim 11, wherein a back wall of the plenum is formed from part of the back interior wall of the cabinet.

13. The gaming machine of claim 1, wherein the plenum includes an interior first compartment and an interior second compartment, at least one of the compartments being respectively separated from other interior parts of the plenum by a respective wall with apertures wherein the first compartment is coupled to receive air flow from the first vent and wherein the second compartment is coupled to exhaust air flow out to the second vent.

14. The gaming machine of claim 13, wherein the filter mechanism is disposed within the first compartment and wherein the gaming machine controller is disposed within the second compartment.

15. The gaming machine of claim 14, wherein the filter mechanism is removable from the first compartment while the plenum-accessing door remains locked.

16. The gaming machine of claim 1, wherein the plenum includes an opening and a cover fitting over the opening that is adjacent to the fan wherein the cover is removable to allow access to the fan.

17. The gaming machine of claim 1, wherein the air filtration and cooling system further includes one or more temperature sensors disposed within the plenum and coupled to a controller wherein the controller is communicatively coupled to control the fan based on temperature sensed by the one or more temperature sensors and wherein the controller controls the fan so as to cause at least one of the following: 1) turning the fan on and off, 2) changing a speed of the fan and 3) causing combinations of turning the fan on and off and changing the speed of the fan.

18. The gaming machine of claim 17, wherein the controller determines whether the fan is operable or not and when it is determined the fan is inoperable, to generate and send a maintenance request to a remote device.

19. The gaming machine of claim 1, wherein the air filtration and cooling system further includes one or more air quality sensors, one of the air quality sensors being disposed within the plenum, the one or more air quality sensors being coupled to a controller wherein the controller 1) receives data from the one or more air quality sensors and 2) based upon the data, determines whether the filter mechanism needs maintenance.

20. The gaming machine of claim 1, wherein the non-volatile memory and the power-hit tolerant memory are disposed within the plenum.

* * * * *